United States Patent
Horch

(10) Patent No.: US 10,468,426 B2
(45) Date of Patent: Nov. 5, 2019

(54) ASYMMETRIC DENSE FLOATING GATE NONVOLATILE MEMORY WITH DECOUPLED CAPACITOR

(71) Applicant: Synopsys, Inc., Mountain View, CA (US)

(72) Inventor: Andrew E. Horch, Seattle, WA (US)

(73) Assignee: Synopsys, Inc., Mountain View, CA (US)

( * ) Notice: Subject to any disclaimer, the term of this patent is extended or adjusted under 35 U.S.C. 154(b) by 135 days.

(21) Appl. No.: 15/841,206

(22) Filed: Dec. 13, 2017

(65) Prior Publication Data

US 2018/0108666 A1 Apr. 19, 2018

Related U.S. Application Data

(60) Division of application No. 14/488,531, filed on Sep. 17, 2014, now Pat. No. 9,853,036, which is a
(Continued)

(51) Int. Cl.
*G06F 17/50* (2006.01)
*H01L 27/11521* (2017.01)
(Continued)

(52) U.S. Cl.
CPC .... *H01L 27/11521* (2013.01); *G06F 17/5072* (2013.01); *G06F 17/5077* (2013.01);
(Continued)

(58) Field of Classification Search
CPC ............. G06F 17/5045; G06F 17/5068; H01L 27/11517; H01L 27/11519; H01L 27/11521; H01L 27/11526
(Continued)

(56) References Cited

U.S. PATENT DOCUMENTS 7,095,076 B1 8/2006 Han et al.
7,474,568 B2 1/2009 Horch
(Continued)

FOREIGN PATENT DOCUMENTS

CN 1595534 3/2005
CN 101300668 11/2008
(Continued)

OTHER PUBLICATIONS

Chen, I-C. et al., "A Quantitative Physical Model for the Band-to-Band Tunneling-Induced Substrate Hot Electron Injection in MOS Devices," IEEE Transactions on Electron Devices, Jul. 1992, pp. vol. 39, No. 7, pp. 1646-1651.
(Continued)

*Primary Examiner* — Paul Dinh
(74) *Attorney, Agent, or Firm* — Fenwick & West LLP

(57) ABSTRACT

A nonvolatile memory ("NVM") bitcell with one or more active regions capacitively coupled to the floating gate but that are separated from both the source and the drain. The inclusion of capacitors separated from the source and drain allows for improved control over the voltage of the floating gate. This in turn allows CHEI (or IHEI) to be performed with much higher efficiency than in existing bitcells, thereby the need for a charge pump to provide current to the bitcell, ultimately decreasing the total size of the bitcell. The bitcells may be constructed in pairs, further reducing the space requirements of the each bitcell, thereby mitigating the space requirements of the separate capacitor/s. The bitcell may also be operated by CHEI (or IHEI) and separately by BTBT depending upon the voltages applied at the source, drain, and capacitor/s.

20 Claims, 17 Drawing Sheets

Related U.S. Application Data continuation of application No. 13/361,796, filed on Jan. 30, 2012, now Pat. No. 8,853,761.

(51) Int. Cl.
| | | |
|---|---|---|
| *H01L 29/423* | (2006.01) | |
| *H01L 29/788* | (2006.01) | |
| *H01L 27/11519* | (2017.01) | |
| *H01L 27/11558* | (2017.01) | |
| *G11C 16/04* | (2006.01) | |
| *H01L 49/02* | (2006.01) | |
| *H01L 29/78* | (2006.01) | |

(52) U.S. Cl.
CPC .... *G11C 16/0408* (2013.01); *H01L 27/11519* (2013.01); *H01L 27/11558* (2013.01); *H01L 28/60* (2013.01); *H01L 29/42324* (2013.01); *H01L 29/7833* (2013.01); *H01L 29/7881* (2013.01)

(58) Field of Classification Search
USPC .................................................. 716/110, 126
See application file for complete search history.

(56) References Cited

U.S. PATENT DOCUMENTS

| | | | |
|---|---|---|---|
| 7,508,719 | B2 | 3/2009 | Horch |
| 7,718,492 | B2 | 5/2010 | Horch |
| 7,800,156 | B2 | 9/2010 | Roizin et al. |
| 7,919,805 | B1 | 4/2011 | Mirgorodski et al. |
| 7,939,861 | B2 | 5/2011 | Horch |
| 7,948,020 | B2 | 5/2011 | Roizin et al. |
| 2003/0183871 | A1 | 10/2003 | Dugger et al. |
| 2005/0007200 | A1 | 1/2005 | Inoue et al. |
| 2007/0015332 | A1 | 1/2007 | Hemink et al. |
| 2007/0097743 | A1 | 5/2007 | Fang et al. |
| 2007/0099430 | A1 | 5/2007 | Higgins et al. |
| 2007/0148867 | A1 | 6/2007 | Park et al. |
| 2007/0279987 | A1 | 12/2007 | Fang et al. |
| 2007/0296020 | A1 | 12/2007 | Shiba et al. |
| 2008/0135904 | A1 | 6/2008 | Roizin et al. |
| 2008/0137410 | A1 | 6/2008 | Fang et al. |
| 2008/0153225 | A1 | 6/2008 | Fang et al. |
| 2008/0229269 | A1* | 9/2008 | Lamorey ............ G11C 14/0081 716/126 |
| 2009/0080257 | A1 | 3/2009 | Oka et al. |
| 2009/0090948 | A1 | 4/2009 | Sato |
| 2009/0181506 | A1 | 7/2009 | Chen et al. |
| 2009/0213660 | A1 | 8/2009 | Pikhay et al. |
| 2010/0157669 | A1 | 6/2010 | Audzeyeu et al. |
| 2010/0171169 | A1 | 7/2010 | Mitani et al. |
| 2010/0270605 | A1 | 10/2010 | Choi et al. |
| 2010/0302854 | A1 | 12/2010 | Wu et al. |
| 2011/0163356 | A1 | 7/2011 | Zhu et al. |
| 2011/0163380 | A1 | 7/2011 | Sleight et al. |
| 2013/0007686 | A1 | 1/2013 | Lu |

FOREIGN PATENT DOCUMENTS

| | | |
|---|---|---|
| CN | 102714222 | 10/2012 |
| EP | 1091418 | 4/2001 |

OTHER PUBLICATIONS

PCT International Search Report and Written Opinion, PCT Application No. PCT/US13/21980, dated Mar. 29, 2013, 14 pages.
PCT International Search Report and Written Opinion, PCT Application No. PCT/US13/21981, dated Mar. 29, 2013, 13 pages.
Taiwan Office Action, Taiwan Application No. 102103628, dated Nov. 13, 2014, 20 pages.
Taiwan Office Action, Taiwan Application No. 102103627, dated Mar. 12, 2015, 19 pages.
Taiwan Office Action, Taiwan Application No. 102103628, dated Mar. 24, 2015, 18 pages.
Chinese First Office Action, Chinese Application No. 201380005155.8, dated Feb. 19, 2016, 8 pages.
Chinese First Office Action, Chinese Application No. 201380007152.8, dated Apr. 25, 2016, 21 pages.
Chinese Second Office Action, Chinese Application No. 2013800071528, dated Dec. 30, 2016, 9 pages.
United States Office Action, U.S. Appl. No. 14/488,531, dated Feb. 14, 2017, 16 pages.
United States Office Action, U.S. Appl. No. 14/488,531, dated Mar. 1, 2016, 16 pages.
United States Office Action, U.S. Appl. No. 14/488,531, dated Jul. 22, 2015, 15 pages.
United States Office Action, U.S. Appl. No. 13/361,796, dated Nov. 12, 2013, 19 pages.
United States Office Action, U.S. Appl. No. 13/361,796, dated Aug. 23, 2013, 15 pages.

* cited by examiner

ASYMMETRIC DENSE FLOATING GATE NONVOLATILE MEMORY WITH DECOUPLED CAPACITOR

CROSS REFERENCE TO RELATED APPLICATIONS

This application is a divisional of U.S. application Ser. No. 14/488,531, filed Sep. 17, 2014, now U.S. Pat. No. 9,853,036, which is a continuation of U.S. Pat. No. 8,853, 761, filed Jan. 30, 2012, both of which are hereby incorporated by reference in their entirety.

BACKGROUND

1. Field of Art

This disclosure generally relates to the field of nonvolatile memory, particularly nonvolatile memory bitcell layouts.

2. Description of the Related Art

Nonvolatile memory (NVM) refers to memory that persistently stores information bits when not powered. A nonvolatile memory bitcell (NVM bitcell) stores a single bit of data. Some types of NVM bitcells are implemented using transistors with floating gates. The amount of charge residing on a floating gate determines whether the bitcell is storing a logical "1" or a logical "0". The floating gate is referred to as "floating" because the gate is electrically isolated from the surroundings by an oxide or dielectric. Some NVM can store more than one state in the bitcell.

In order to expand applications and reduce costs of memory devices, it is desirable to accommodate a large number of bitcells in a given area. It is also desirable to decrease the cost of fabricating each bitcell by using standard complementary metal-oxide-semiconductor manufacturing processes ("CMOS processes"). Currently available memory devices include EEPROM and eFLASH, both of which have disadvantages. Currently, eFLASH has a very small bitcell, but requires steps in addition to the standard CMOS process, which increases the cost of producing the bitcell and possibly changes the performance or characteristics of the produced devices. EEPROM is compatible with standard CMOS processes, but has a relatively large bitcell size, and thus is only suitable for low bit count memories.

SUMMARY

Embodiments relate to a nonvolatile memory ("NVM") bitcell with one or more active regions capacitively coupled to the floating gate but that are separated from both the source and the drain. The inclusion of capacitors separated from the source and drain allows for improved control over the voltage of the floating gate. This in turn allows channel hot electron injection ("CHEI") or impact ionized hot electron injection ("IHEI") to be performed with much higher efficiency than in existing bitcells, thereby reducing the the size of a charge pump, and in some cases even the need for a charge pump to provide current to the bitcell, decreasing the total size of the bitcell. The bitcells may be constructed in pairs, further reducing the space requirements of the each bitcell, thereby mitigating the space requirements of the separate capacitor contacts. The bitcell may also be operated by CHEI (or IHEI) and separately by band-to-band tunneling ("BTBT") depending upon the voltages applied at the source, drain, and capacitors.

In one example embodiment, a non-volatile memory bitcell includes a first active region in a substrate, the first active region including a source and a drain. A second active region is also present in the substrate, where the second active region is separated from the first active region by a nonconductive region. A floating gate is located above the first active region between the source and the drain. The floating gate is also located above the second active region and the nonconductive region. A capacitor is formed by a first plate consisting of the portion of the floating gate above the second active region, and a second plate consisting of the portion of the second active region underneath the floating gate. The capacitor is separated from the source and the drain.

In another example embodiment, a non-volatile memory bitcell includes a first active region in a substrate including a source and a drain. A second active region is also present in the substrate, and is separated from the first active region by a first nonconductive region. A third active region is also present in the substrate, and is separated from the first active region and the second active region by a second nonconductive region. A floating gate is located above the first active region between the source and the drain. The floating gate is also located above the second active region, the third active region, and both nonconductive regions. A capacitor is formed by a first plate consisting of the portion of the floating gate above the second active region, and a second plate consisting of the portion of the second active region underneath the floating gate. Additionally, a band to band tunneling (BTBT) capacitor is formed by a first plate consisting of the portion of the floating gate above the third active region, and a second plate consisting of the portion of the third active region underneath the floating gate.

BRIEF DESCRIPTION OF DRAWINGS

Figure (FIG. 1A illustrates a top view of a NVM bitcell according to one embodiment.

DETAILED DESCRIPTION

Embodiments relate to a nonvolatile memory ("NVM") bitcell with one or more active regions capacitively coupled to the floating gate but electrically decoupled from both the source and the drain. The inclusion of capacitors separated from the source and drain allows for improved control over the voltage of the floating gate. This in turn allows CHEI (or IHEI) to be performed with much higher efficiency than in existing bitcells, thereby reducing the size of charge pump needed to provide current to the bitcell, decreasing the total size of the memory. The bitcells may be constructed in pairs, further reducing the space requirements of the each bitcell, thereby mitigating the space requirements of the separate capacitor contacts. The bitcell may also be operated by CHEI (or IHEI) and separately by BTBT depending upon the voltages applied at the source, drain, and capacitor/s.

The bitcell may be created using a standard complementary metal-oxide-semiconductor manufacturing processes ("CMOS processes"). "NVM bitcell," "bitcell" or "bit" described herein refers to CMOS type (i.e., transistor based) nonvolatile memory. A CMOS NVM bitcell is distinguished from other types of NVM memory such as magnetic memory, such as is found in floppy disks, or optical memory such as is found in CDs or DVDs. NVM bitcells are produced using a CMOS process that includes a number of process steps in a fabrication facility ("fab").

Decoupled Capacitor Bitcell

Figure 1A:
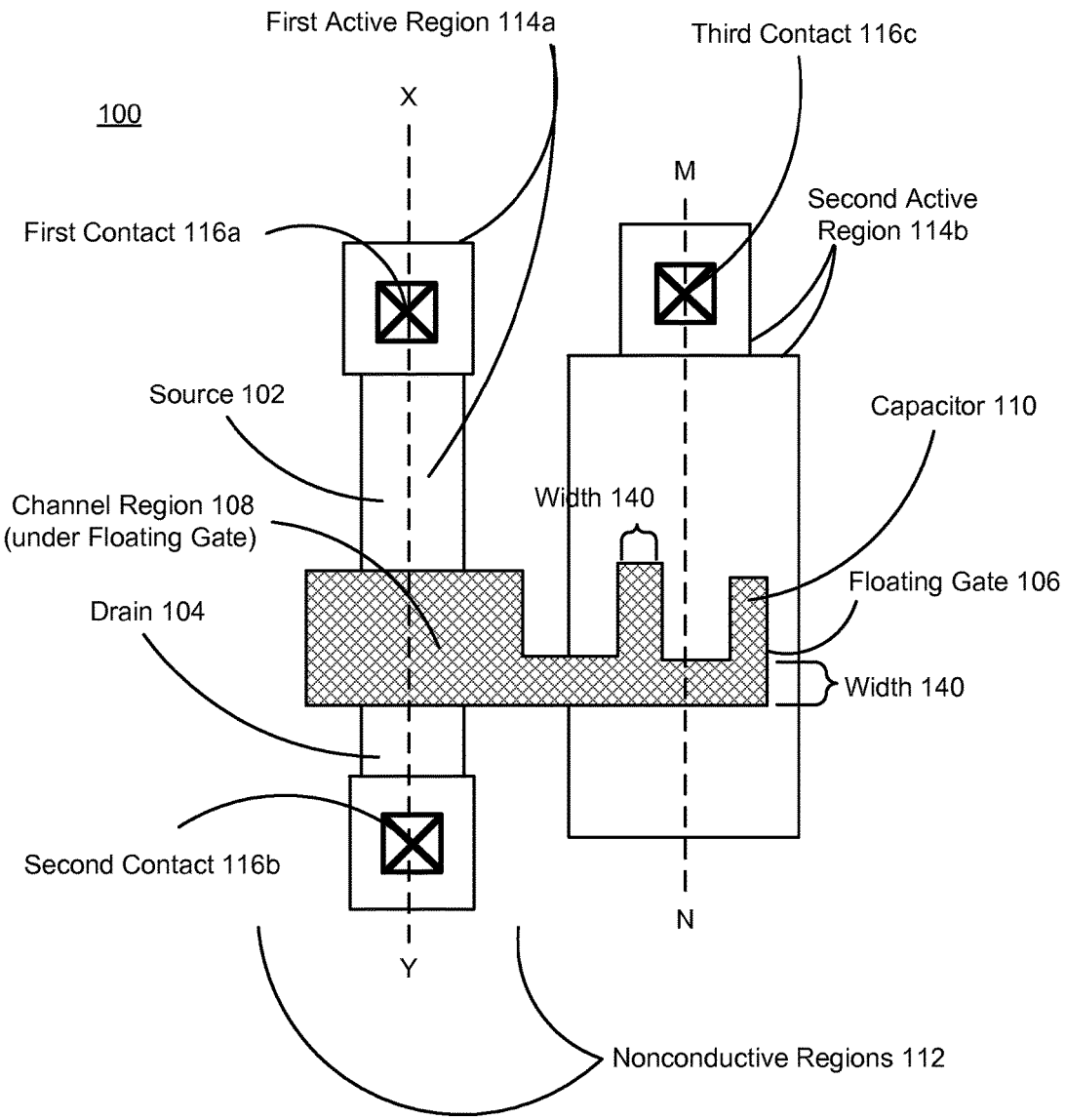
FIGS. 1B and 1C are cross sectional diagrams a NVM bitcell according to one embodiment.
FIG. 1D is a circuit diagram of a paired NVM bitcell according to one embodiment.
FIG. 1E is a top view of a paired NVM bitcell according to one embodiment.

Figure (FIG. 1A illustrates a top view of a NVM bitcell according to one embodiment. The bitcell 100 is embodied as either a P-type or a N-type floating gate MOSFET. The bitcell 100 includes a floating gate 106 that traverses two separate active regions 114a, 114b, which are isolated from each other by nonconductive region 112. Nonconductive region 112 may also surround the active regions 114a, 114b. The first active region 114a includes both the source 102 and the drain 104 of the bitcell. The source 102 and the drain 104 are separated by a channel region 108 underneath the floating gate 106.

The floating gate 106 also extends at least partway over a second active region 114b. The surface area coverage of the floating gate 106 over the second active region 114b is shaped such that ion implantations of charge carriers into the second active region 114b are able to penetrate underneath the portion of the floating gate 106 residing over the second active region 114b during an implantation process. In one embodiment, the width 140 of the floating gate 106 is below a threshold so that implants of charge carriers into the second active region 114b are able to penetrate underneath the portion of the floating gate 106 residing over the second active region 114b. In one embodiment, these implanted charge carriers penetrate all the way underneath the floating gate 106. Consequently, a capacitor 110 is formed where the first plate of the capacitor is floating gate 106, and the second plate of the capacitor is the second active region 114b.

The bitcell 100 has three separate electrical contacts that can apply voltage to the bitcell, thereby affecting the charge on the floating gate 106. The source 102 is coupled to the first contact 116a, the drain 104 is coupled to the second contact 116b, and the capacitor 110 is coupled to the third contact 116c.

Figure 1B:
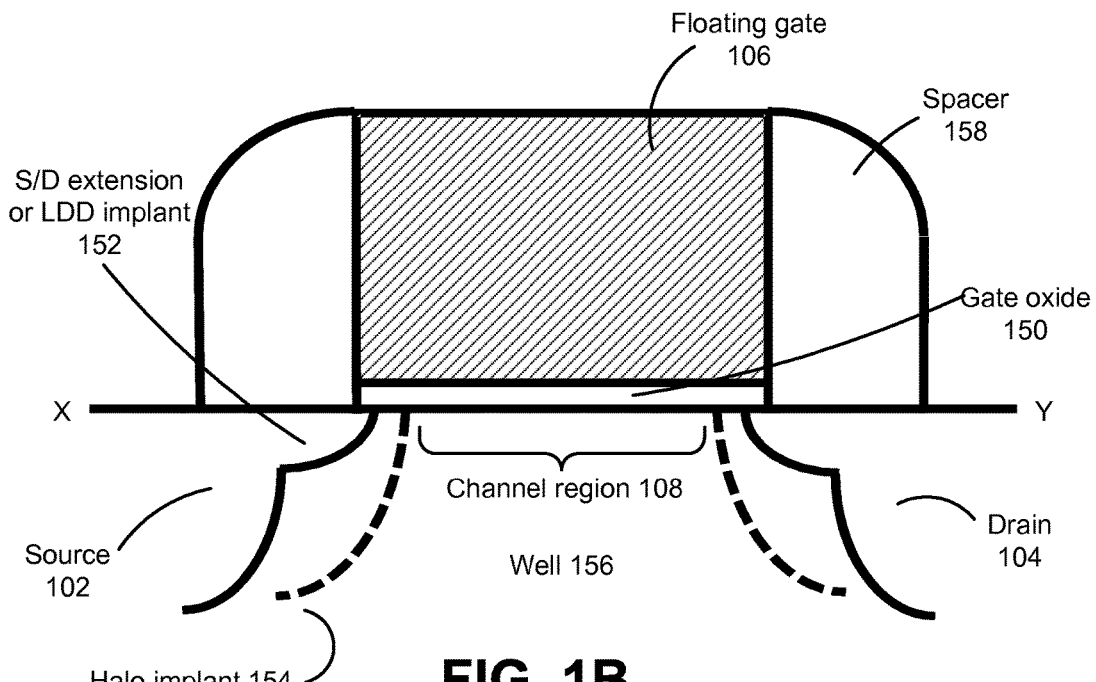
Figure 1C:
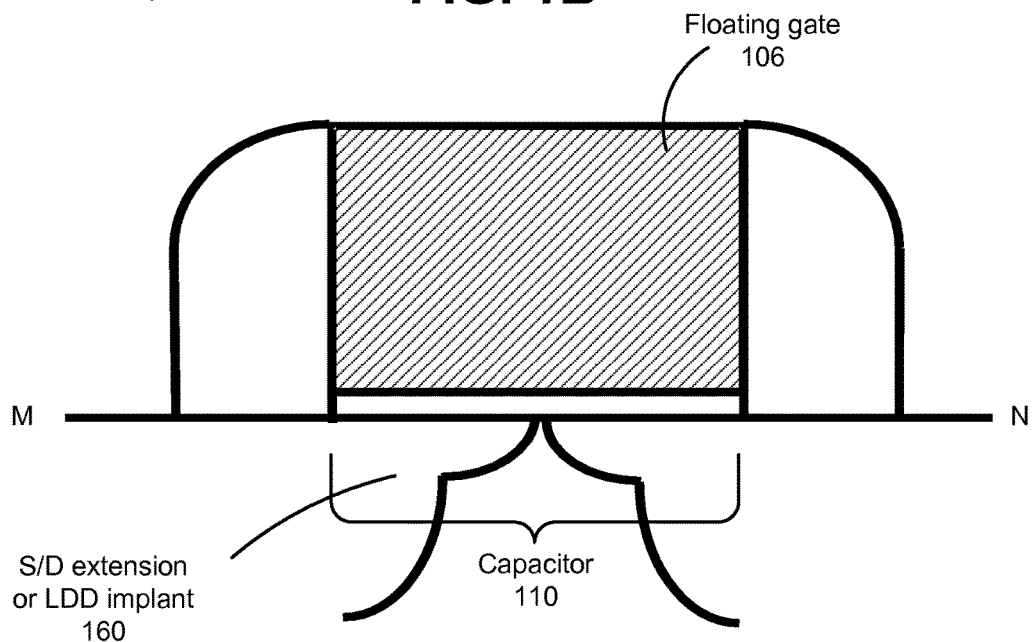

FIGS. 1B and 1C are cross sectional diagrams a NVM bitcell according to one embodiment. FIG. 1B illustrates a cross section of NVM bitcell 100 taken along axis X/Y from FIG. 1A, in the region of the bitcell corresponding to the first active region 114a. Bitcell 100 includes a floating gate 106 sitting on top of gate oxide 150. The floating gate 106 is surrounded by one or more spacers 158. The spacers may be made of an oxide or another nonconductive material. The gate oxide 150 rests on top of an active region 114a. The active regions 114 may be a silicon substrate, or alternatively they may be a silicon on insulator (SOI) type substrate. In another embodiment, the bitcell 100 is part of a multiple gate (or FinFET) device.

The active region 114a includes a well 156, where near the surface of the well 156 a channel region 108 forms when the bitcell 100 is turned on. The channel region 108 is covered by floating gate 106. The active region 114a also includes a source 102 and drain 104. The size of the channel region 208 is characterized by the flow of carriers between the source 102 and drain 104 regions depending upon the voltage at the source 102, drain 104, the charge on the floating gate 106, the voltage on the capacitor 110, the doping of the source 102 and drain 104, the thickness of the gate oxide 150, and other characteristics of the bitcell 100 such as dimensions and the materials used.

The source 102 and drain 104 may include different levels of implanted charge carriers. In one embodiment, the source 102 and/or the drain 104 include a source-drain (S/D) extension 152. In one embodiment, the source 102 and/or the drain 104 include a lightly doped drain (LDD) implant 152. In one embodiment, the source 102 and/or the drain 104 include a halo implant 154. The source and drain regions can be doped differently from each other to form an asymmetric device. For example, the drain may have an implant that the source does not, or vice versa.

In various embodiments, the dopings of the source 102, drain 104, first active region 114a, and second active region 114b may be changed to alter the behavior of the device. In one embodiment, the second active region 114b has an implant of a same polarity as a source/drain implant in the first active region. This adjusts the threshold voltage VT of both the capacitor 110 and the read device (i.e., through channel region 108). The capacitor 110 would receive the implant to lower its VT, and the read device would receive the implant to raise its VT. In another embodiment, the drain includes a halo implant and a source/drain extension implant. The halo implant on the drain may be formed using two different photo/implant steps. In another embodiment, the first active region 114a has an implant of opposite polarity as the source and drain, and the second active region 114b does not have the implant. In another embodiment, the source and drain both have a halo implant. In this case, the halo implant of the drain has a higher concentration of charge carriers than the halo implant of the source. In another embodiment, the second active region 114b has an implant of the same polarity as a source and drain implant. In this case, the implant shorts the portion of the second active region 114 under the floating gate 106.

FIG. 1C illustrates a cross section of NVM bitcell 100 taken along axis M/N from FIG. 1A, in the region of the bitcell corresponding to the second active region 114b. In comparison to FIG. 1B, in FIG. 1C, the second active region 114b includes at least one of a S/D extension 160 or a LDD implant 160. Owing to the shape of the floating gate 106 over the second active region 114b, the implanted charge carriers 160 extend underneath the floating gate 106, in some embodiments all the way underneath the floating gate as illustrated in FIG. 1C. The floating gate 106 and charge carrier implants 160 form the two plates of capacitor 110.

Figure 1D:
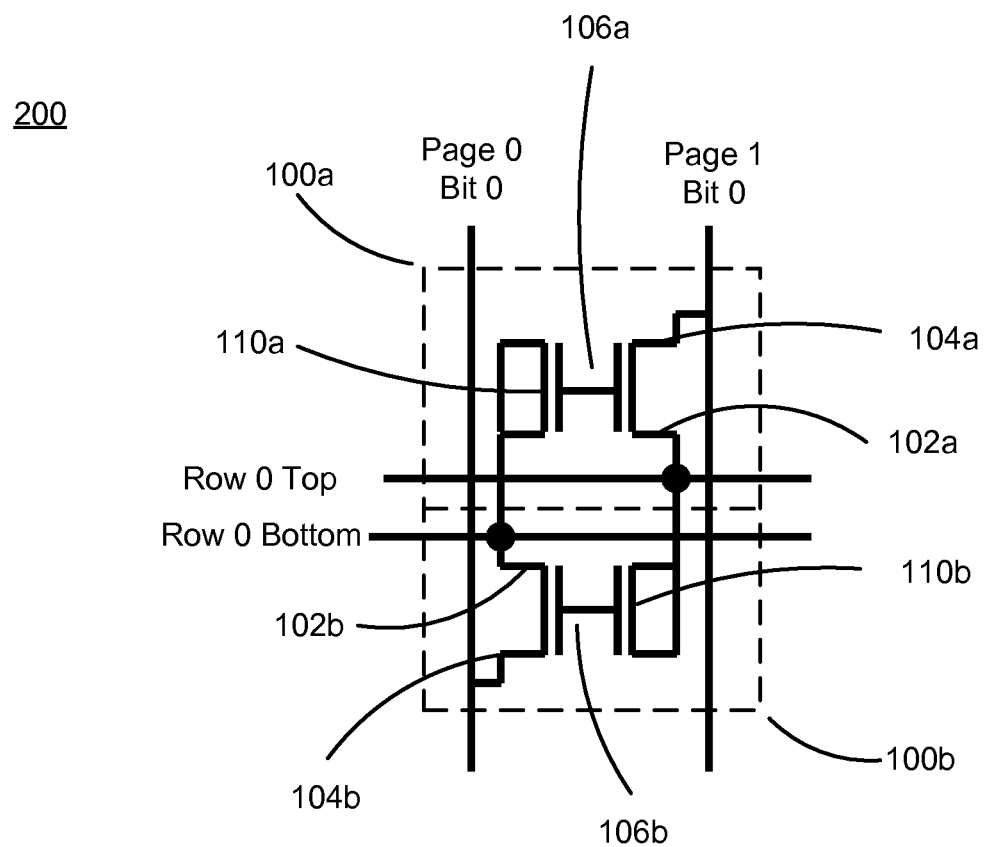
Figure 1E:
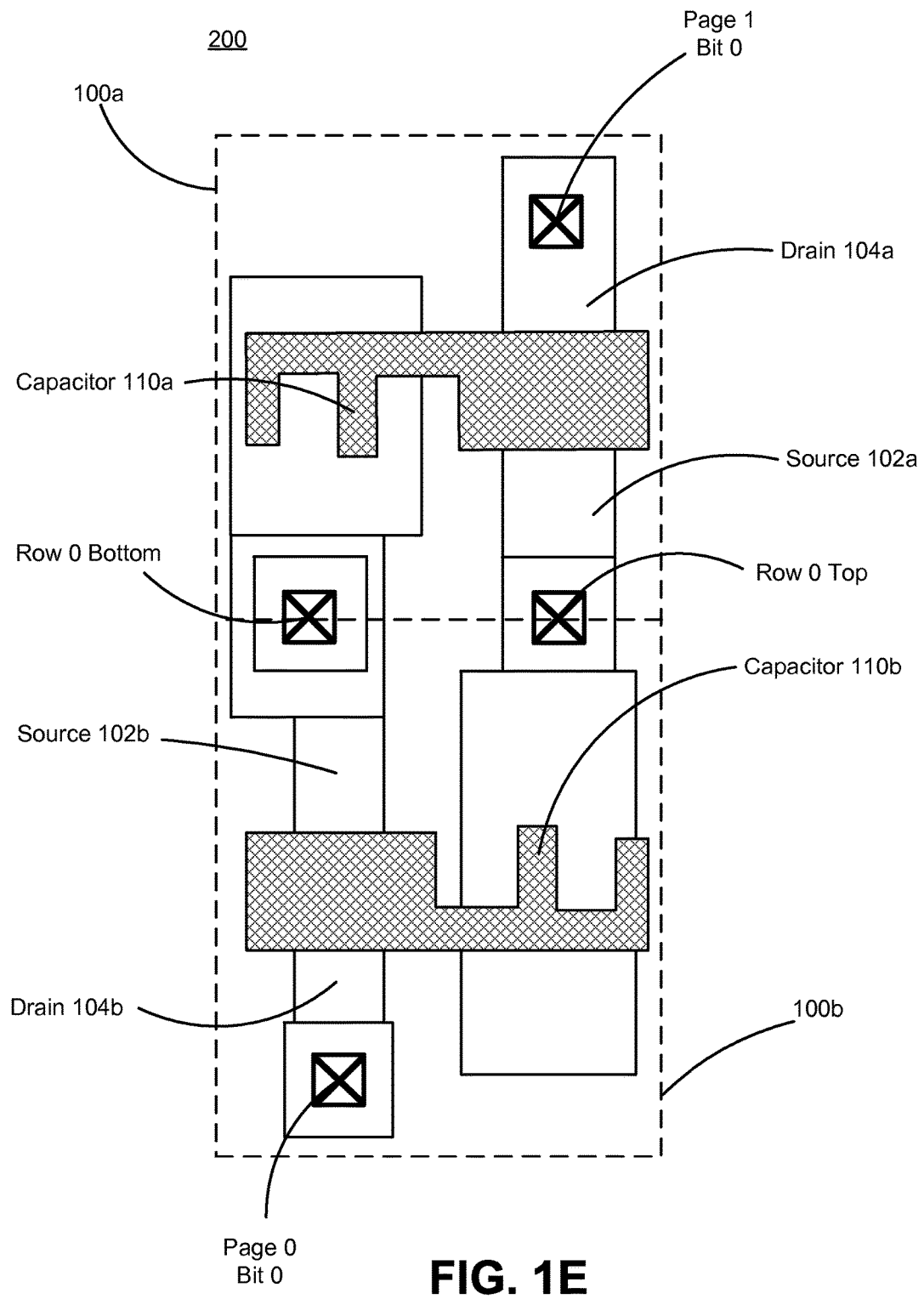

In order to reduce the spatial requirements of the bitcell 100, bitcells 100 may be "paired". Paired bitcells are constructed as approximate flipped inverses of each other, as illustrated in FIGS. 1D and 1E. FIG. 1E is a circuit diagram of a paired NVM bitcell according to one embodiment. Paired bitcell 200 includes two separate individual bitcells 100a and 100b. Each bitcell 100a and 100b includes a similar floating gate 106, source 102, drain 104, and capacitor 110. For example, bitcell 100a includes floating gate 106a, source 102a, drain 104a, and capacitor 110a, whereas bitcell 100b includes floating gate 106b, source 102b, drain 104b, and capacitor 110b.

Although an individual bitcell 100a or 100b has three electrical contacts that are operated to make the bitcell function, in one embodiment the paired bitcell 200 has only four electrical contacts to control the operation of two individual bitcells 100a and 100b. In this construction, bitcells 100a and 100b share two electrical contacts in order to reduce the total number of electrical contacts needed to operate the bitcells. Each drain 104a and 104b has its own electrical contact. In a memory structure with many bitcells arranged in array fashion, these electrical contacts may be assigned identities to distinguish bits from each other. For example, the electrical contact for drain 104a may be referred to as the page 1, bit 0 contact, and the electrical contact for drain 104b may be referred to as the page 0, bit 1 contact.

The sources 102a and 102b, however, share an electrical contact with the capacitor of the other bitcell in the pair, in this case 110b and 110a, respectively. For example, the source 102a of bitcell 100a shares an electrical contact with the capacitor 110b of bitcell 100b. This electrical contact may be referred to as the row 0 top contact. The source 102b of bitcell 100b shares an electrical contact with the capacitor 110a of bitcell 100a. This electrical contact may be referred to as the row 0 bottom contact.

FIG. 1D illustrates one possible way of arranging the electrical contact lines for a paired bitcell 200. In one embodiment, the electrical contacts for the paired bitcell 200 are creating using a plurality of layers of metal that are deposited separately so that they are electrically isolated from each other. FIG. 1E is a top view of a paired NVM bitcell according to the same embodiment depicted in FIG. 1D.

Figure 2A:
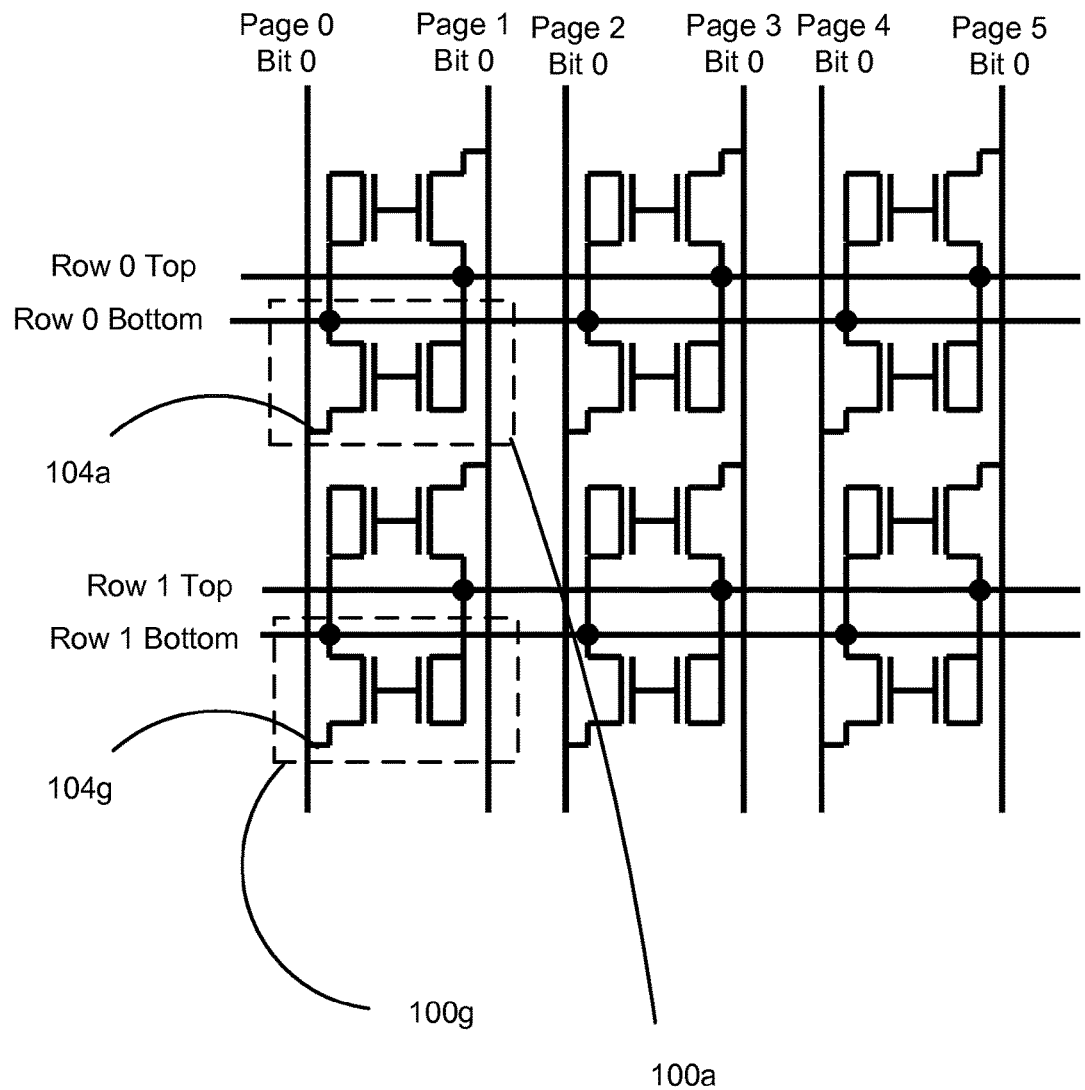
FIG. 2A is a circuit diagram of a paired NVM bitcell array according to one embodiment.

FIG. 2A is a circuit diagram of a paired NVM bitcell array according to one embodiment. A bitcell array shares electrical contacts between bitcells in order to minimize the number of electrical contacts needed to operate the bitcell array. The bitcell array shares electrical contacts in a row and column format such that by selectively powering specific rows and arrays, individual bitcells in the array can be controlled.

Columns are coupled to the drains 104 of bitcells in the array. Each column may be referred to as a "page", as bitcell 100 has a column-page architecture, for example, Pages 1 through 5 in FIG. 2A. Each page may be shared between drains 104 of bitcells in different rows of the bitcell array. For example, electrical contacts for columns are shared between rows, such that a bitcell 100a shares a drain 104a electrical contact, here page 0, with drain 104g of bitcell 100g. Rows are coupled to the sources 102 and capacitors 110 of bitcells in the array, for example Rows 0 and 1 in FIG. 2A. In one embodiment, the rows are each split up into two separate groups, the row top contacts and the row bottom contacts.

Figure 2B:
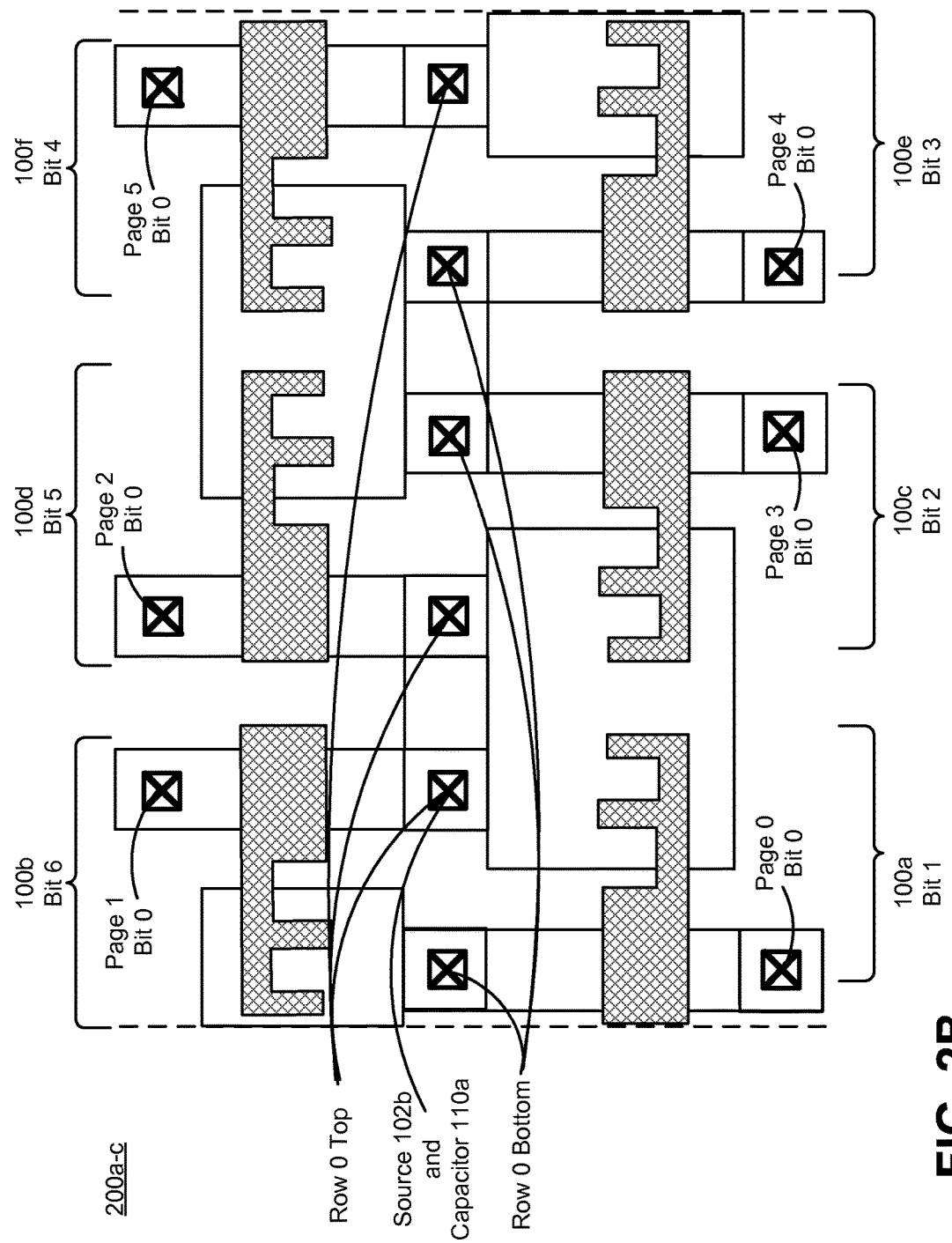
FIG. 2B is a top view of a paired NVM bitcell array according to one embodiment.

FIG. 2B is a top view of a paired NVM bitcell array according to one embodiment.

FIG. 2B illustrates three paired bitcells 200 of a single row, along with six columns of the array. FIG. 2B illustrates three paired bitcells 200 or six individual bitcells 100 in a single row of a bitcell array, however the illustrated row of the bitcell array may continue as indicated by the dotted lines at the edge of the drawing. FIG. 2B illustrates only a single row of bitcells, however a bitcell array may include many similar rows. Bitcells 100a and 100b make up a first paired bitcell 200a, bitcells 100c and 100d make up the second paired bitcell 200b, and bitcells 100e and 100f make up a third paired bitcell 200c.

In the example of FIG. 2B, the row 0 top contact shares the source 102b of a second bitcell 100b with the capacitor 110a of a first bitcell 100a, the source 102d of a fourth bitcell 100d, the capacitor 110c of a third bitcell 100c, the source 102f of a sixth bitcell 100f, the capacitor 110e of a fifth bitcell 100e, and the sources and capacitors of other bitcells in the first row connected to row 0 top (not shown). Similarly, the row 0 bottom contact shares the source 102a of a first bitcell with the capacitor 110d of a fourth bitcell, the source 102c of a third bitcell 102c, the source 102e of a fifth bitcell 100e, the capacitor 110f of a sixth bitcell 102f, and the sources and capacitors of other bitcells in the first row not connected to row 0 top (not shown).

Figure 2C:
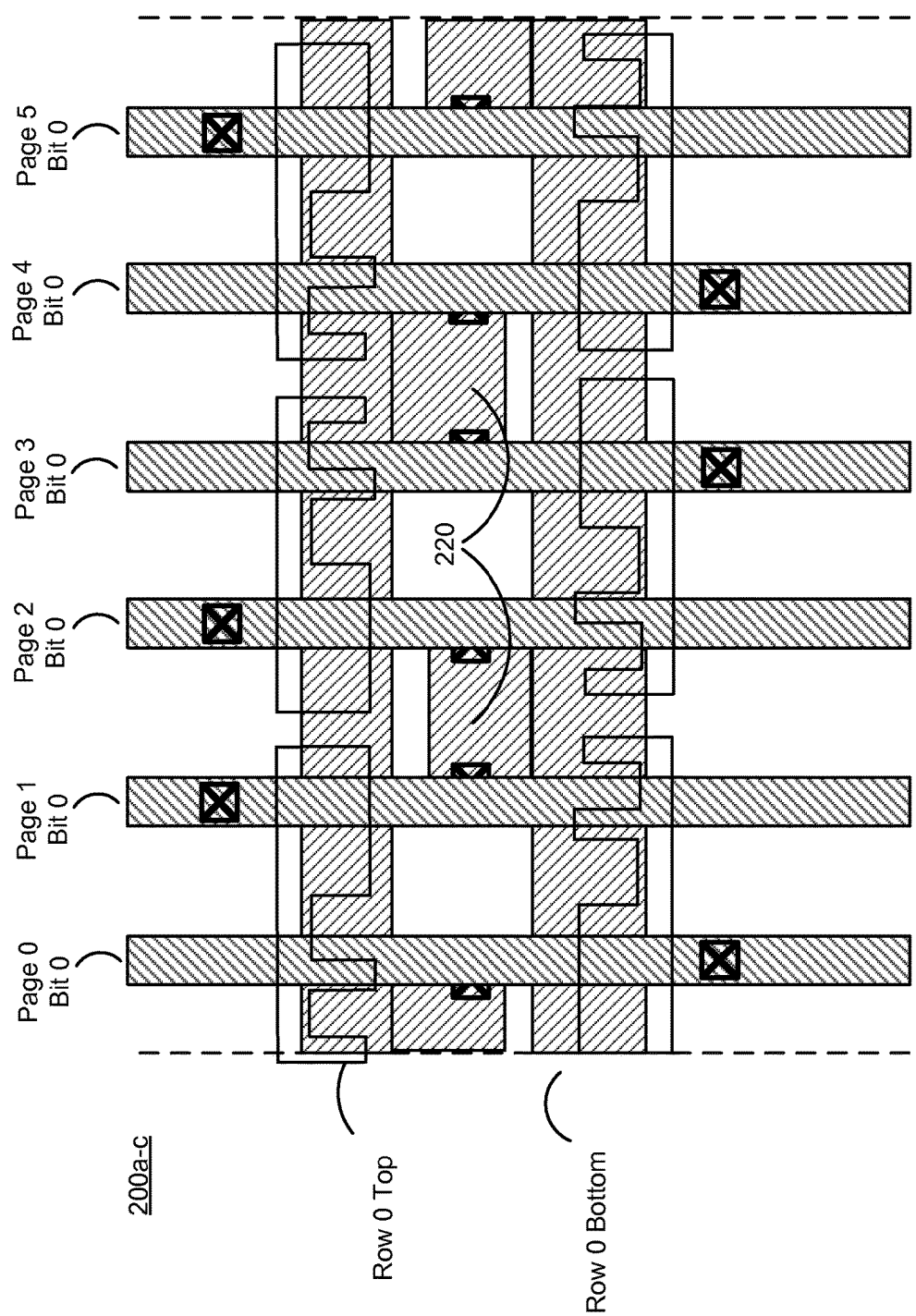
FIG. 2C is a top view of a paired NVM bitcell array with metal layers according to one embodiment.

FIG. 2C is a top view of a paired NVM bitcell array with metal layers according to one embodiment. In FIG. 2C, the floating gates 106 of the bitcells 100 are overlaid for readability only, as the floating gates are electrically isolated from the metal layers which power the bitcells. In FIG. 2C, the page metal layers are deposited vertically whereas the row metal layers are deposited horizontally. In one embodiment, the row metal layers generally run perpendicularly to the column metal layers. In one embodiment, the row metal layers comprise overlap sections 220 that protrude from the row metal layers to couple the row metal layers to the sources 102 and capacitors 110 of the bitcells 100. The coupling between electrical contacts occurs vertically, perpendicular to the plane of the substrate. These overlap sections 220 may be interlaced between the row top and row bottom metal layers in order to further save space in the overall size of the bitcell array.

Figure 3A:
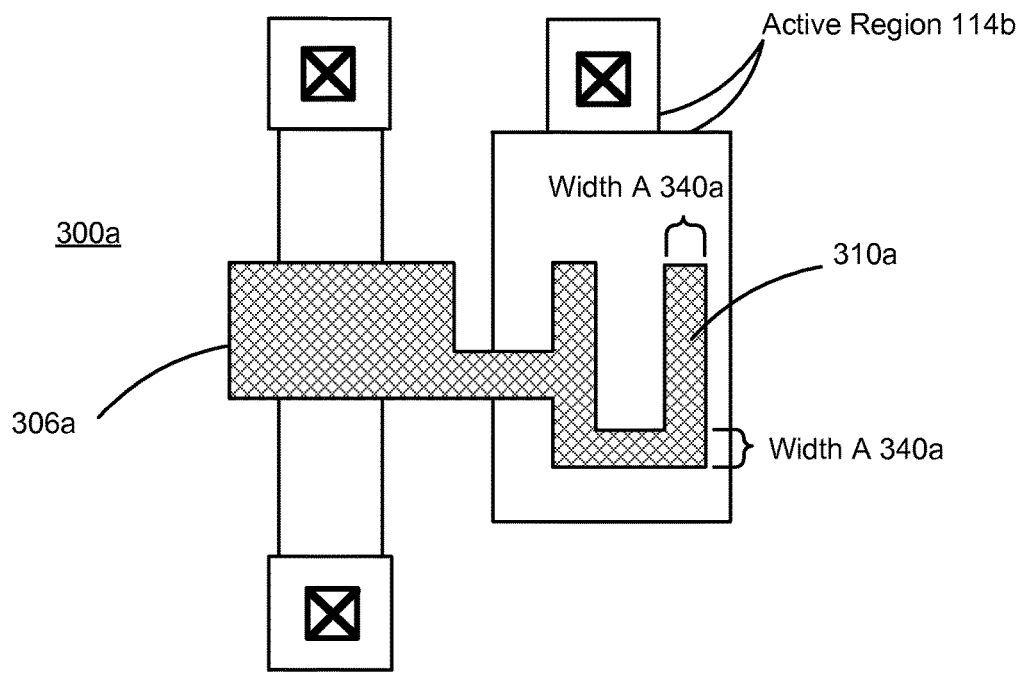
FIG. 3A is a top view of a NVM bitcell with a modified capacitor structure according to one embodiment.

FIG. 3A is a top view of a NVM bitcell 300a with a modified capacitor structure according to one embodiment. The capacitance of the capacitor 310a is determined by the shape of the floating gate 306a over the second active region 114b, as the floating gate 306a serves as one plate of the capacitor. Additionally, the shape of the floating gate 306a determines, at least in part, where implants of additional charge carriers will enter the second active region 114b, thereby forming the second plate of the capacitor 310a. Depending upon the size and shape of the floating gate 306a over the second active region 114b, the capacitance between the floating gate 306a and the second active region 114b will change. Generally, increasing the size of the floating gate 306b over the second active region 114b increases the capacitance in regions of the floating gate 306b where implants in the second active region 114b are able to penetrate underneath the floating gate 306.

If the width of the floating gate 306a is greater than a specified width 340a, then implants of additional charge carriers will not be able to penetrate all the way underneath this widened region of the floating gate 306a, regardless of angle of implantation. This allows room for a channel region below the widened region. The widened region of the floating gate acts as a transistor. When the width of the floating gate is equal to the specified width 340a or less, then the LDD implants short together under the floating gate. When the implants short under the floating gate 306, the floating gate 306 is completely capacitively coupled to the active region 114b. Further, in this case it is isolated from the well or substrate below the active region 114b.

In the embodiment of FIG. 3A, the shape and size of the floating gate 306a has been altered from the embodiment of the floating gate 106 shown in FIG. 1A to increase the surface area of the floating gate 306a over the second active region 114b compared to the embodiment illustrated in FIG. 1A. At all points above the second active region 114b, floating gate 306a has a width A 340a that is less than or equal to a threshold width at which implanted charge carriers can no longer penetrate all the way underneath the floating gate 306a. Other shapes that increase the surface area of the floating gate 306a over the second active region 114b without exceeding the specified width are also contemplated. Other shapes that increase the surface area of the floating gate 306a over the second active region 114b while also exceeding the specified width are also contemplated.

Figure 3B:
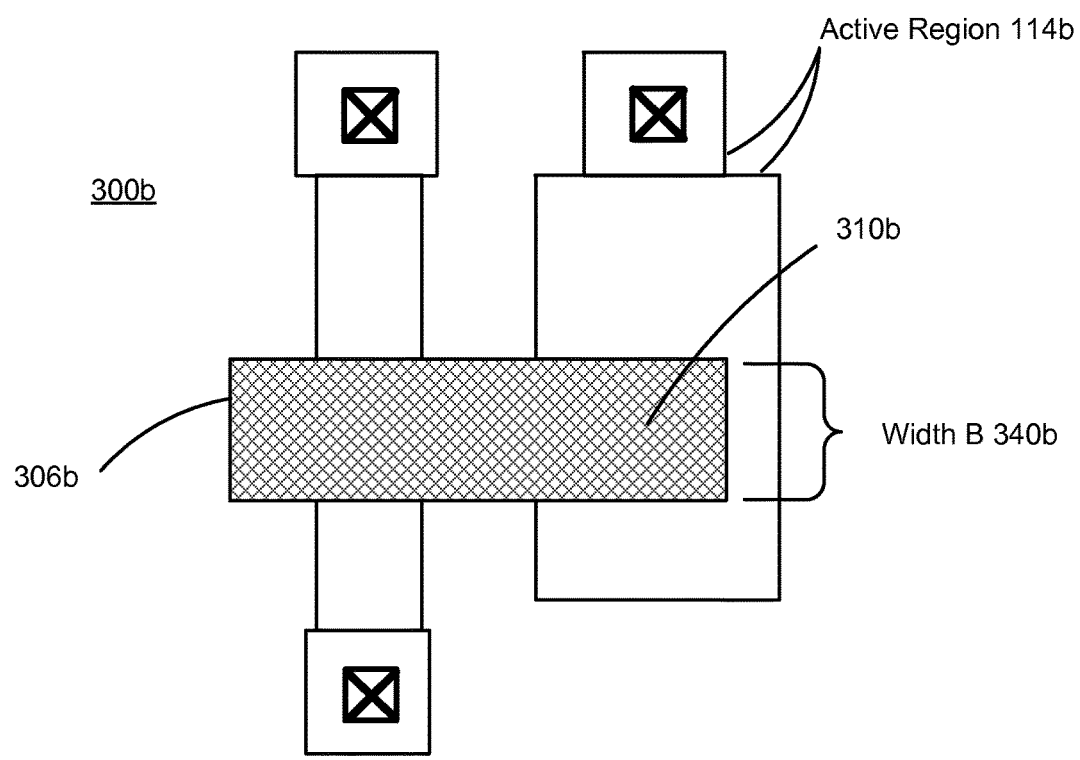
FIG. 3B is a top view of a NVM bitcell with a modified capacitor structure with additional photolithography implants according to one embodiment.

FIG. 3B is a top view of a NVM bitcell 300b with a modified capacitor structure having additional photolithography implants according to one embodiment. In this embodiment, rather than constraining the width of the floating gate, an additional photolithography or photo-implantation step is added to the standard CMOS logic process. In this embodiment, the photo implant step implants additional charge carriers into the second active region 114b before the floating gate 306b is added to the bitcell 300b. As the floating gate 306a has not yet been added to the bitcell, the photo implant may implant charge carriers anywhere on the second active region 114b to form one of the plates of the capacitor 310b, regardless of the width 340b of the floating gate 306b. The additional implant isolates the floating gate capacitor 310b from the well or substrate below it. In other embodiments the capacitor is not isolated from the well below it.

As a consequence, the floating gate 306b does not need to be limited to the threshold width described above in order to increase the capacitance between the floating gate 306b and the second active region 114b. In one embodiment, floating gate 306b has a width B 340b greater width A 340a. In this embodiment, active region 114b has a photo implant of additional charge carriers.

Figure 3C:
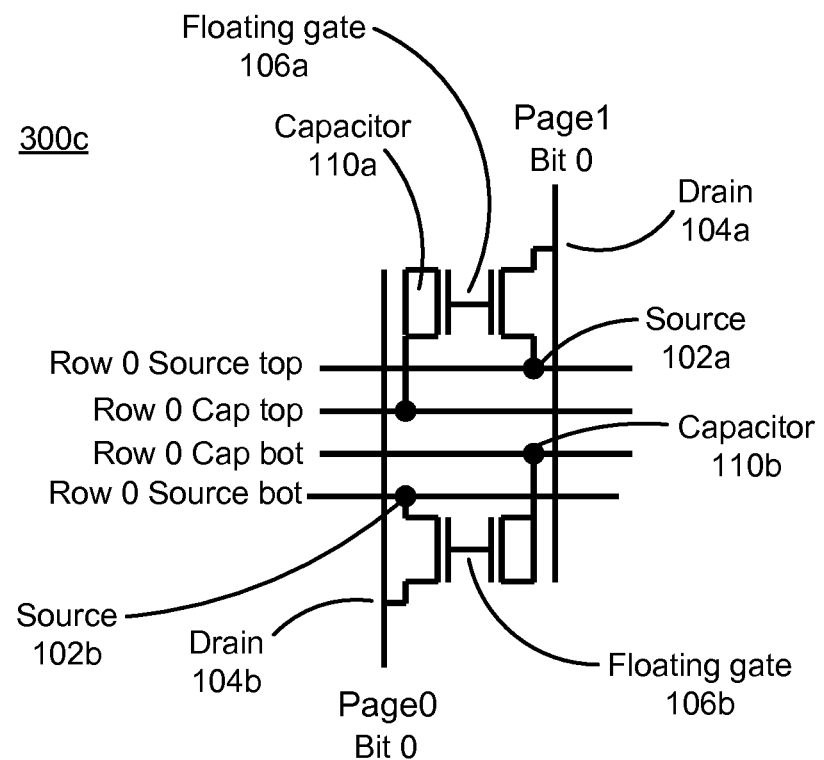
FIG. 3C is a circuit diagram of a NVM bitcell with extra metal contacts according to one embodiment.

FIG. 3C is a circuit diagram of a paired NVM bitcell 300c with extra electrical contacts according to one embodiment. A paired bitcell 300c does not share electrical contacts between source 102a and capacitor 110b. Instead, each source 102 and capacitor 110 has its own electrical contact which it shares with other bitcells in the same row of a bitcell array (not shown).

The sources 102 of bitcells in paired bitcell 300c in a single row of a bitcell array share an electrical contact with either a row source top electrical contact, or with a row source bottom electrical contact. The capacitors 110 of bitcells in paired bitcell 300c in a single row of a bitcell array share an electrical contact with either a row capacitor top electrical contact, or with a row capacitor bottom electrical contact. Having separate electrical contacts for sources 102 and capacitors 110 of bitcells in paired bitcell 300c allows greater control and flexibility over which bits are written, read, or erased when electrical current is applied to the bitcell array.

Decoupled Capacitor Bitcell Operation

The structure of bitcell 100 allows for a great deal of control over how the bitcell 100 is operated. The bitcell 100 uses band-to-band tunneling (BTBT) to program the floating gate, and uses channel hot electron injection (CHEI) or impact ionized hot election injection (IHEI), depending upon whether the bitcell is N-type or P-type, to erase the floating gate. The following description describes operation of a N-type bitcell 100 using CHEI to erase, however the concepts apply equally to a P-type bitcell using IHEI to erase instead.

One of many advantages to bitcell 100 is that because capacitor 110 is decoupled from both the source 102 and the drain 104, the capacitor 110 can be used to adjust the voltage on the floating gate 106 without affecting the voltages at the source 102 or the drain 104. Due to the capacitance between floating gate 106 and the second active region 114b, the floating gate 106 voltage will be a proportion of whatever voltage is applied at the second active region 114b. For example, if there is a 50% capacitive coupling between the floating gate 106 and the second active region 114b, then the floating gate 106 voltage will coupled by 50% of the voltage change applied to the second active region 114b (i.e., the capacitor 110 electrical contact). The ability to bias the floating gate without affecting the source 102 voltage or the drain 104 improves the efficiency of read and CHEI/IHEI operations, and improves control over BTBT operations.

To erase the floating gate 106 via CHEI, the source 102 and drain 104 voltages are separately adjusted to create a voltage drop between the source 102 and the drain 104. The source is set to a high voltage, for example 7 volts (V), and the drain is set to a low voltage, for example 0V. The voltage drop establishes a high intensity electric field between the source 102 and the drain 104 across the channel region 108. The electric field causes electrons to accelerated from the source 102 towards the drain 104. Some of the electrons will have enough energy (e.g., they are "hot" enough) to be injected onto the floating gate 106.

By controlling the gate voltage, through the capacitor, CHEI can be better optimized. By independently making the gate voltage higher than the source-drain voltage Vds, CHEI efficiently is increased to a point. In one implementation, CHEI can be efficiently done by bringing the floating gate up to 8V while the voltage drop between the source and the drain (Vds) to 5V. In one implementation, bitcell 100 is a 5V bitcell with asymmetric implants on the source and drain.

In bitcell 100 during erase operations the voltage of the floating gate 106 can be adjusted while CHEI is taking place to maximize electron injection efficiency. For example, coupling the floating gate 106 to a low voltage by applying a low voltage at the capacitor 110 improves injection efficiency, without affecting the voltages at the source 102 or the drain 104. CHEI can be further optimized by changing the value of the capacitor 110 voltage as the voltage at the floating gate 106 changes due to CHEI in order to maintain higher CHEI efficiency.

Maintaining high CHEI efficiency decreases the amount of current needed by the bitcell to perform CHEI and therefore to erase the floating gate 106. Decreasing the amount current needed to perform erase operations means that CHEI can be performed with the supply voltage for the source and drain voltages thus removing the requirement for a charge pump that produces currents high enough to perform CHEI. Removing the charge pump from the bitcell greatly reduces the size and complexity of a memory infrastructure including the bitcell 100. Further, in some embodiments a charge pump may be used only to drive the capacitor thereby reducing the load on the charge pump and thereby decreasing the size of the charge pump necessary to drive the capacitor load.

To write to the floating gate 106 via BTBT, the source 102 and the drain 104 voltages are separately adjusted to create a strong electric field near the drain 104. BTBT occurs when a strong electric field is present near a depletion region located near the border of a doped region at the drain 104 and a channel region 108. The presence of a high voltage, for example 6 to 8V, at the edge of the doped region of the drain 104, and the paucity of charge carriers in the depletion region of the channel region 108 causes holes to tunnel over to the floating gate 106.

BTBT may also be described as a reverse diode breakdown effect, where the forward direction would be current passing from the source 102 and channel region 108 to the drain 104. In the reverse direction under large voltages the diode breaks down and holes tunnel onto the floating gate 106. If the voltage on the drain remains relatively constant, when sufficient holes tunnel to the floating gate 106, the gated diode will no longer be above the breakdown voltage and BTBT will shut off. Thus, BTBT allows for comparatively precise control for the number of charge carriers added to the floating gate 106.

In one embodiment, BTBT can be enhanced by asymmetrically doping the drain 104 as compared to the source 102. For example, the addition of a halo implant 154 causes the depletion region to decrease in size, creating more favorable conditions for the tunneling of holes onto the floating gate 106 when a high voltage is applied to the drain 104. Increasing the dopant concentration causes the depletion region width to shrink. The smaller the distance a given voltage is across the higher the electric field will be. The higher the electric field, the more energy an electron or hole will pick up when it crosses the depletion region.

To read the voltage on floating gate 106, the source 102, drain 104 and capacitor are set to different voltages that will turn the bitcell 100 on or off depending upon the voltage on the floating gate 106. For an example N-type bitcell 100, assume the bitcell 100 has a threshold voltage $V_T$ of 0.5 V. A logical state of 0 (i.e., the bitcell 100 is in the "off" state) may be represented by a floating gate 106 voltage of −1 V (assuming the source 102, drain 104, and capacitor 110 are set to 0 V bias). In contrast, a logical state of 1 (i.e., the bitcell is in the "on" state) may be represented by a floating gate 106 voltage of 0 V.

When reading from a bitcell 100, the source 102 voltage is raised to a level such that if the bitcell 100 has a logical state of 1, the bitcell 100 turns on and current flows through channel 108 between the source 102 and the drain 104. If the bitcell has a logical state of 0 and the source 102 voltage is raised to the same level, then the bitcell 100 will not turn on and current will not flow through the channel 108 between the source 102 and the drain 104.

In a bitcell array, the voltage on the capacitor 110 may be altered to selectively read particular bitcells 100 in the bitcell array. In one embodiment of a bitcell array, raising the source 102 voltage alone is insufficient to activate the bitcell regardless of whether the bitcell 100 has a logical value of 1 or 0 stored on the floating gate 106. In this embodiment, raising the capacitor 110 voltage causes the floating gate 106 voltage to be raised to a percentage of the capacitor voltage. Raising the capacitor 110 voltage in conjunction with raising the source voltage 102 allows the activation of the bitcell 100 such that current flows through channel 108. Selecting an appropriate capacitor 110 voltage and source 102 voltage will cause 100 bitcell to turn on if the floating gate 106 has a logical value of 1, and to remain off if the floating gate has a logical value of 0.

Generally, it is advantageous to have a fast read time for a nonvolatile memory bitcell. One way to accomplish fast read times is to read using a large difference in the voltage at the source and the drain of a bitcell. However, if a capacitor is shorted to the source, as is the case with existing nonvolatile memory bitcells, raising the source voltage too high may cause the floating gate to turn on due to capacitive coupling, when it should instead remain off. Since capacitor 110 is decoupled from the source 102 and the drain 104 in bitcell 100, bitcell 100 does not suffer from this problem. The bitcell can be read with a low voltage on the source and drain and a high voltage on the gate. This allows for a relatively high channel current since the device is being used in saturation, but with the source to drain voltage being low enough to avoid having any electrons gain enough energy to be injected through the gate oxide onto the floating gate.

Using a large difference in voltage between the source and drain of a bitcell to perform fast reads may also cause a nonvolatile memory bitcell to suffer unintended CHEI disturbances, where CHEI occurs even though it is not intended due to the high read voltages. Bitcell 100 is able to compensate for and prevent CHEI disturbs by using the capacitor 110 to couple the floating gate 106 to a higher voltage during reads, allowing the use of low source-drain voltages differences for fast reads without causing CHEI disturbances.

Bitcell 100 may also make use of adaptive read schemes which adjust the voltage on the capacitor 110 to compensate for process-voltage-temperature (PVT) variations. PVT variations can affect the amount current provided during read. Repeated cycling (programming and erasing) can result in charge trapping at the interface between the channel 108 and the gate oxide 150. Charge trapping can cause a shift in the threshold voltage $V_T$ of a bitcell, thereby affecting the performance of the bitcell. Adaptive read schemes may be used to compensate for erroneous bitcell performance due to PVT or charge trapping. In one embodiment, an adaptive read scheme is implemented by using a reference bitcell programmed to a logical state of 1 to set bias conditions such that a known read current is provided. The read current of the reference bitcell may be used to adjust the various voltages used to read the bitcell. The reference bitcell should behave the same as the bitcell under various PVT conditions. The adaptive read scheme may then adjust the capacitor 110 voltage to compensate for any changes in the threshold voltage of the bitcell due to PVT variations. In one embodiment, reference bitcells are cycled with respect to row in a bitcell array to better mimic charge trapping behavior and therefore better control the adaptive read scheme.

Table 1 set forth below illustrates read, write, and erase operation for an example N-type embodiment.

TABLE 1

Bitcell 100 Operation

| Operation | Drain (Column) | Source (Row) | Capacitor (Row) | Notes/ Transport Mechanism |
|---|---|---|---|---|
| Read Selected Row | Pre-charge 0 V | Vread 2 V | Vread_cap 1-4 V | Couple up selected row |
| Read Unselected Row | Pre-charge 0 V | 0 V | 0 V | |
| Erase Selected Row (set bit to 0) | 0 V | Vinj 7 V | 0-5 V | CHI inject e-, capacitor set to give peak e- injection efficiency |
| Inhibit Erase on Selected Row (keep bit at 1) | Vinj_inhibit 2-4 V or float | Vinj 7 V | 0-5 V | inhibit e- injection |
| Inihibit Erase on Unselected Row (keep bit at 1) | X | 0 V | 0 V or Vinj_inhibit 2 V | inhibit e- inject |
| Write Column (set bit to 1) | Vbtbt 6-8 V | 0 V | 0 V or Vbtbt_cap 2 V | BTBT, inject h+ per page |
| Inhibit Write on Column (keep bit at 0) | 0 V | 0 V | 0 V or Vbtbt_inhibit 2 V | BTBT, inhibit h+ inject, Bit programming possible with high $V_T$ device |

Decoupled Capacitor and BTBT Capacitor Bitcell

Figure 4A:
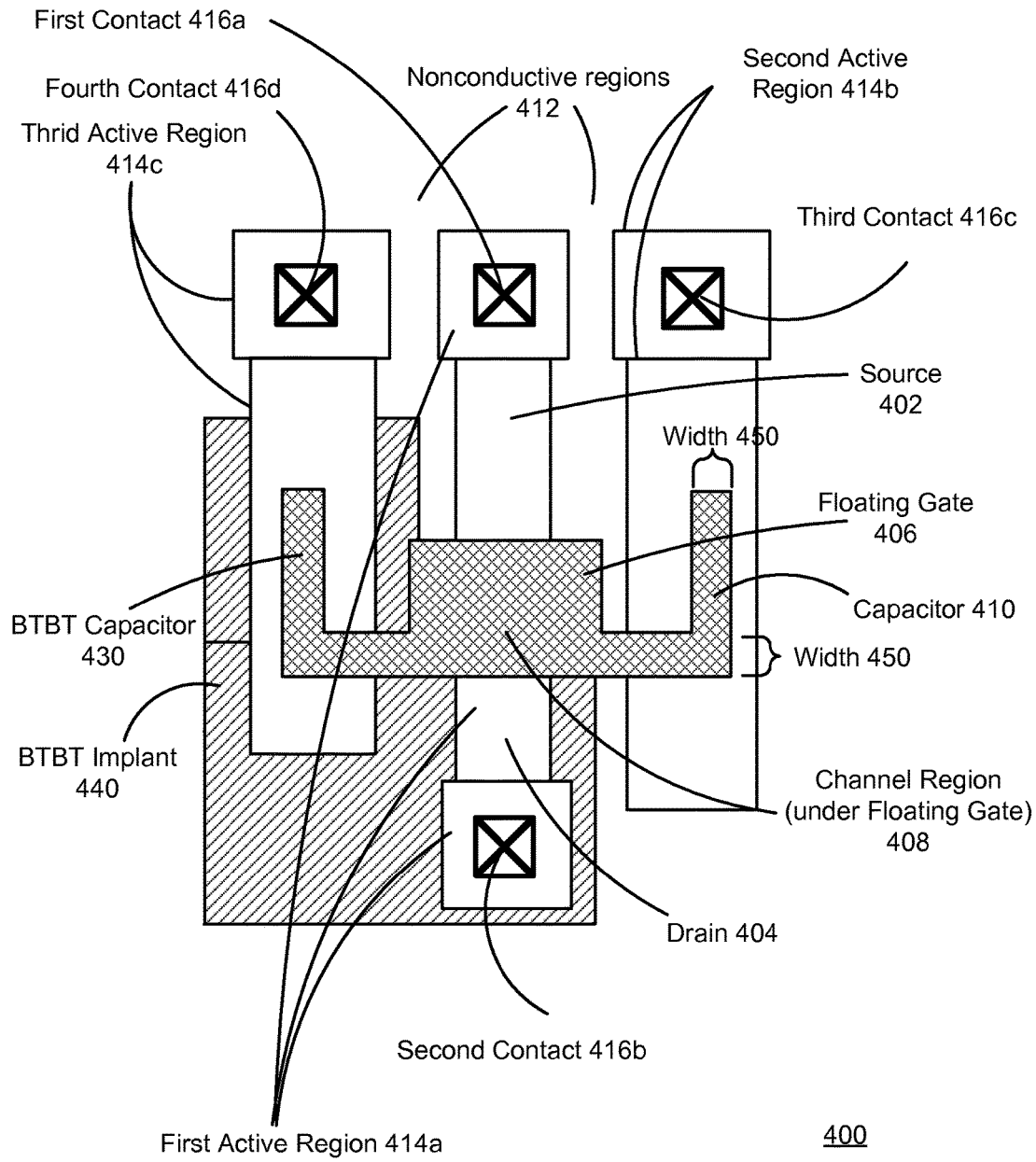
FIG. 4A is a top view of a NVM bitcell according to one embodiment.

FIG. 4A is a top view of a NVM bitcell according to one embodiment. The bitcell 400 is embodied as either a P-type or a N-type a floating gate MOSFET. The bitcell 400 includes a floating gate 406 that traverses three separate active regions 414a through 414c, which are isolated from each other by nonconductive regions 412. Nonconductive region 412 may also surround the active regions 414a through 414c. The first active region 414a includes both the source 402 and the drain 404 of the bitcell 400. The source 402 and the drain 404 are separated by a channel region 408 underneath the floating gate 406.

The floating gate 406 also extends at least partway over a second 414b and third 414c active regions. The surface area coverage of the floating gate 406 over the third 414c active region is shaped such that source drain extension implantations or HV (high voltage) or LV (low voltage) lightly doped drain (LDD) implants of charge carriers into the third 414c active region are able to penetrate only part of the way underneath the portion of the floating gate 406 residing over the third 414c active region during an implantation process. The source drain extension implants are LDD implants of an opposite conductivity type than the conductivity type of the well of the third active region 414c. The charge carriers penetrate only part of the way under this portion of the floating gate 406 based on the width of the floating gate 406, An additional halo implant (referred to as the BTBT implant 440) is also implanted into the third active region 414c. The BTBT implant may penetrate either part way or all the way underneath the floating gate 406 in the third active region 414c.

The surface area coverage of the floating gate 406 over the second active region 414b is shaped such that ion implantations of charge carriers into the second active region are able to penetrate all the way underneath the portion of the floating gate 406 residing over the second active region 414b during an implantation process. In one embodiment, the width 450 of the floating gate 406 over the second active region 414b is below a threshold so that implants of charge carriers are able to penetrate all the way underneath that portion of the floating gate 406.

Consequently, capacitor 410 is formed where the first plate of the capacitor 410 is floating gate 406, and the second plate of the capacitor 410 is the second active region 414b. Similarly, BTBT capacitor 430 is formed where the first plate of the BTBT capacitor 430 is floating gate 406, and the second plate of the BTBT capacitor 430 is the third active region 414c.

The bitcell 400 has four electrical contacts that can apply voltage to the bitcell, thereby affecting the charge on the floating gate 106. The source 402 is coupled to the first contact 416a, the drain 404 is coupled to the second contact 416b, the capacitor 410 is coupled to the third contact 416c, and the BTBT capacitor 430 is coupled to the fourth contact 416d.

The BTBT implant 440 configured to facilitate the occurrence of BTBT at the BTBT capacitor. The BTBT implant 440 changes the concentration of charge carriers underneath the floating gate 406 in the portion of the third active region 414c not penetrated by other implants (e.g., a source drain extension implant or a LDD implant). This creates a sharp gradient in the type and concentration of charge carriers at the border between the BTBT implant 440 and other implants underneath the floating gate 406. As a result of the presence of different types of charge carriers underneath the floating gate 406 in the third active region 414c, the BTBT capacitor 430 is also a transistor, where the channel region is formed by the undoped well as well as the halo implant (both of which consist of charge carriers of the same type). However, the source and drain of this transistor are shorted to one another. Thus even if the transistor "on" due to the application of a voltage to the third active region 414c, no current will flow in this channel region. The BTBT implant also facilitates CHEI and IHEI.

The BTBT capacitor 430 acts like a gated diode. Under high BTBT capacitor 430 voltages, the diode formed at the boundary of the BTBT implant 440 and another implant will breakdown, inducing the transfer of charge carriers by BTBT. The presence of the BTBT implant 440 enhances this effect as compared to a device that does not have such an implant. The BTBT implant doping concentration makes the depletion width of the transistor of the BTBT capacitor 430 smaller than it would be otherwise at the border between the BTBT implant 440 and another implant. In BTBT, applied voltage creates an electric field through the depletion region, which gives electrons crossing the depletion region more energy. These "hot" electrons impact other atoms created hot hole/electron pairs. Some of these hot holes transition onto the floating gate 406, thereby changing the charge level of the floating gate 406. For an NMOS bitcell, to activate BTBT the active region 414c is pulled to a high voltage (e.g., 6.5V-8V) while the p-well sits on (not shown) is held at ground voltage (e.g., 0V).

Figure 4B:
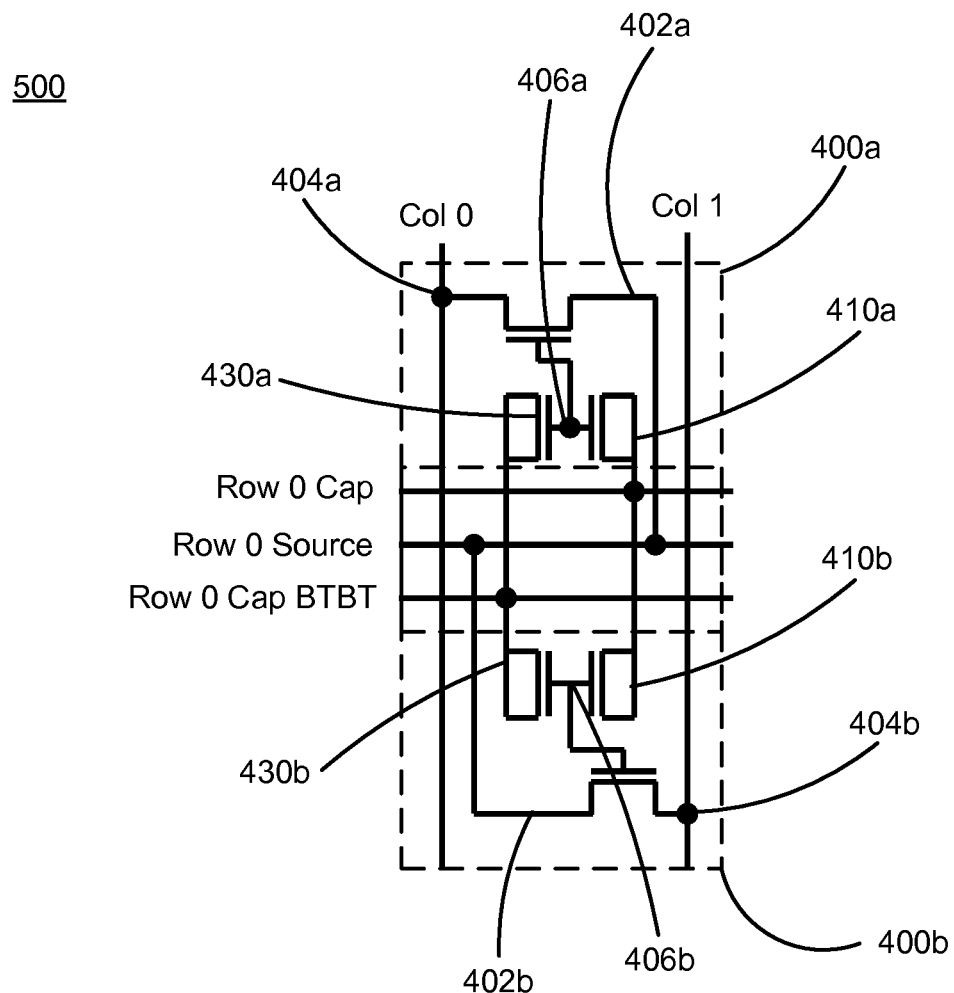
FIG. 4B is a circuit diagram of a paired NVM bitcell according to one embodiment.

FIG. 4B is a circuit diagram of a paired NVM bitcell according to one embodiment. As with bitcells 100, bitcells 400 may be "paired" to reduce the space taken up by many bitcells 400 present in a single bitcell. In one embodiment, bitcell 400a and 400b are constructed as approximate flipped inverses of each other, as illustrated in FIG. 4B. In this construction, bitcells 400a and 400b share electrical contacts in order to reduce the total number of electrical contacts needed to operate the bitcells.

In one embodiment, each drain 404a and 404b has its own electrical contact. For example, the electrical contact for drain 404a may be referred to as the Col 0 contact, and the electrical contact for drain 404b may be referred to as the Col 1 contact. The sources 402a and 402b share an electrical contact with each other. This is in contrast to paired bitcell 200, where the source of a first bitcell shared an electrical contact with a capacitor of the second bitcell in the pair.

Although an individual bitcell 400a or 400b has four electrical contacts that are operated to make each bitcell function, the paired bitcell 500 has only five electrical contacts to control the operation of two individual bitcells 400a and 400b in one embodiment. FIG. 4B illustrates one possible way of arranging the electrical contact lines for a paired bitcell 500. In one embodiment, the electrical contacts for the paired bitcell 500 are creating using a plurality of layers of metal that are deposited separately so that they are electrically isolated from each other.

Figure 4C:
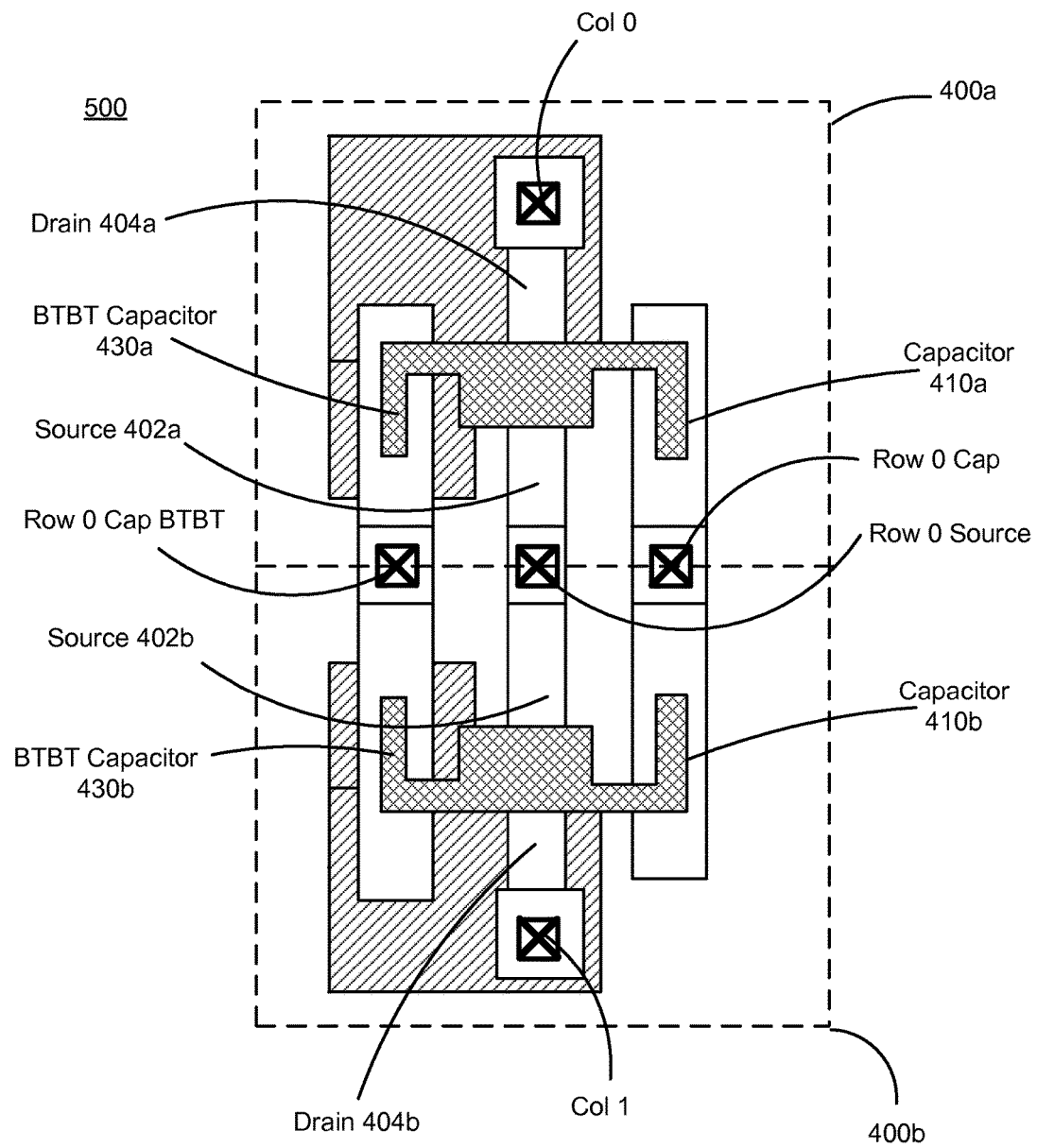
FIG. 4C is a top view of a paired NVM bitcell according to one embodiment.

FIG. 4C is a top view of a paired NVM bitcell 500 according to one embodiment. Paired bitcell 500 includes two separate individual bitcells 400a and 400b. Each bitcell 400a and 400b includes a similar floating gate 406, source 402, drain 404, capacitor 410, and BTBT capacitor 430. For example, bitcell 400a includes floating gate 406a, source 402a, drain 404a, capacitor 410a, and BTBT capacitor 430b, whereas bitcell 400b includes floating gate 406b, source 402b, drain 404b, and capacitor 410b.

Figure 5A:
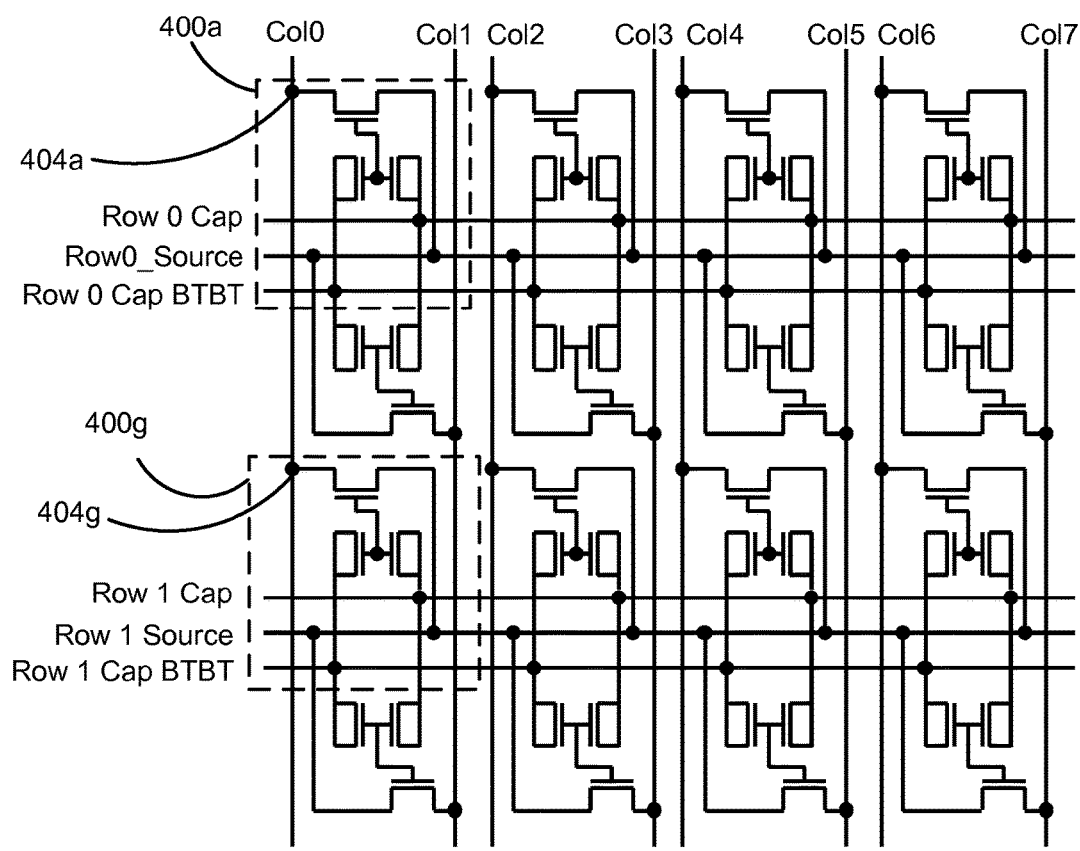
FIG. 5A is a circuit diagram of a paired NVM bitcell array according to one embodiment.

FIG. 5A is a circuit diagram of a paired NVM bitcell array according to one embodiment. Columns are coupled to the drains 404 of bitcells in the array. Each column may be shared between drains 404 of bitcells in different rows of the bitcell array. For example a bitcell 400a shares a drain 404 electrical contact, here Col 0, with drain 404 of bitcell 400g. Each row of a memory array contains a plurality of paired bitcells 500. The row contacts for a single row are split into three separate lines, Row 0 Source which electrically connects the source 402 of each bitcell in Row 0 together, Row 0 Cap which electrically connects the capacitor 410 of each bitcell in Row 0 together, and Row 0 Cap BTBT which electrically connects the BTBT capacitor 430 of each bitcell in Row 0 together.

Having sources 402 and drains 404 with their own electrical contacts and having the BTBT capacitor powered along each row, rather than along each column such as in bitcell 100 allows the bitcell 400 to be constructed using a more conventional row-page architecture. In a row-page architecture, BTBT is induced by setting the BTBT capacitor to a high voltage, which is powered on a row by row basis. In contrast, bitcells 100 and 200 are a less conventional column-page architecture. In a column-page architecture, BTBT is induced by setting the drains 104 to a high voltage, on a column by column basis. A row page architecture makes it easier to scale a bitcell array up to large bit counts while maintaining small page sizes.

Having the BTBT capacitor 430 be both a capacitor as well as a separate transistor with its own source and drain shorted has other advantages as well. If the floating gate 406 is injected to voltage sufficient to form a channel under the floating gate 406 in the third active region 414c, no current is drawn because the source and drain are at the same voltage. This helps prevent operation issues from arising due to variances between bitcells in an array. In contrast, in existing bitcell arrays if one bit turns on due to BTBT before the others due to manufacturing variation, a leakage current is formed that may pull down the high voltage used to cause BTBT, thereby making it more difficult to induce BTBT on the other bitcells in the array. Further, additional implants can be added to the BTBT capacitor 430 without worrying about the effect of the implants on the turn-on voltage, $V_T$ of the BTBT capacitor 430.

Figure 5B:
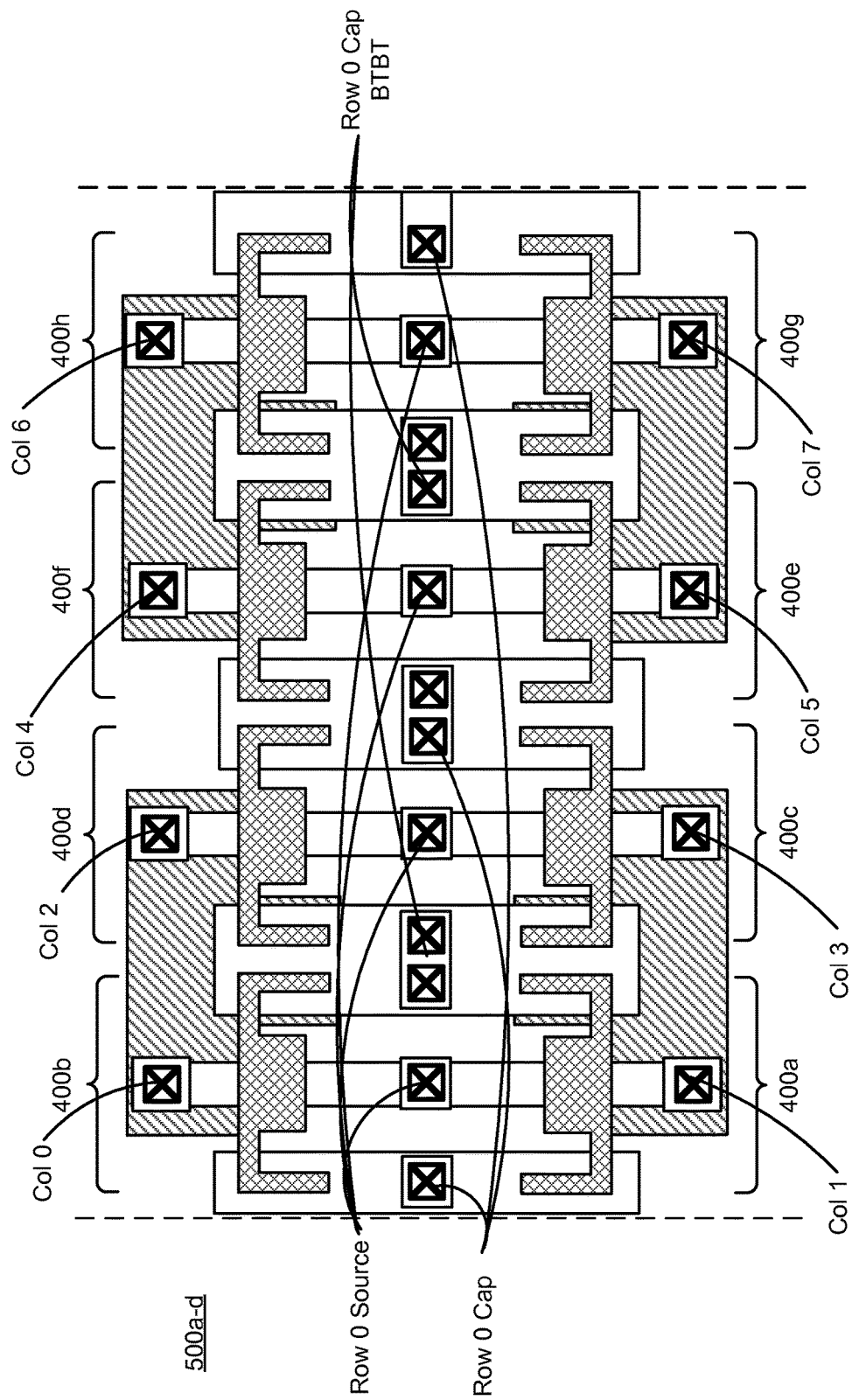
FIG. 5B is a top view of a paired NVM bitcell array according to one embodiment.

Another advantage of having the BTBT capacitor 430 separate from the channel region 108 on the first active region 414a is that it provides immunity to trapped charge during BTBT. In devices that use BTBT, charge trapping at the gate oxide substrate interface can cause the turn on voltage $V_T$ of the device to shift, thereby making it difficult to perform a read operation on the device. By moving BTBT operations to the third active region 414c, this problem is avoided. Charge trapping from CHEI can be minimized by optimizing the CHEI conditions through the independent control of gate, source and drain voltages as described above, FIG. 5B is a top view of a paired NVM bitcell array according to one embodiment. FIG. 5B illustrates four paired bitcells 500 or eight individual bitcells 400 in a single row of a bitcell array, however, the illustrated row of the bitcell array may continue as indicated by the dotted lines at the edge of the drawing. FIG. 5B illustrates only a single row of bitcells, however a bitcell array may include many similar rows. Bitcells 400a and 400b make up a first paired bitcell 500a, bitcells 400c and 400d make up the second paired bitcell 500b, bitcells 400e and 400f make up a third paired bitcell 500c, and bitcells 400g and 400h make up a fourth paired bitcell 500d.

Figure 5C:
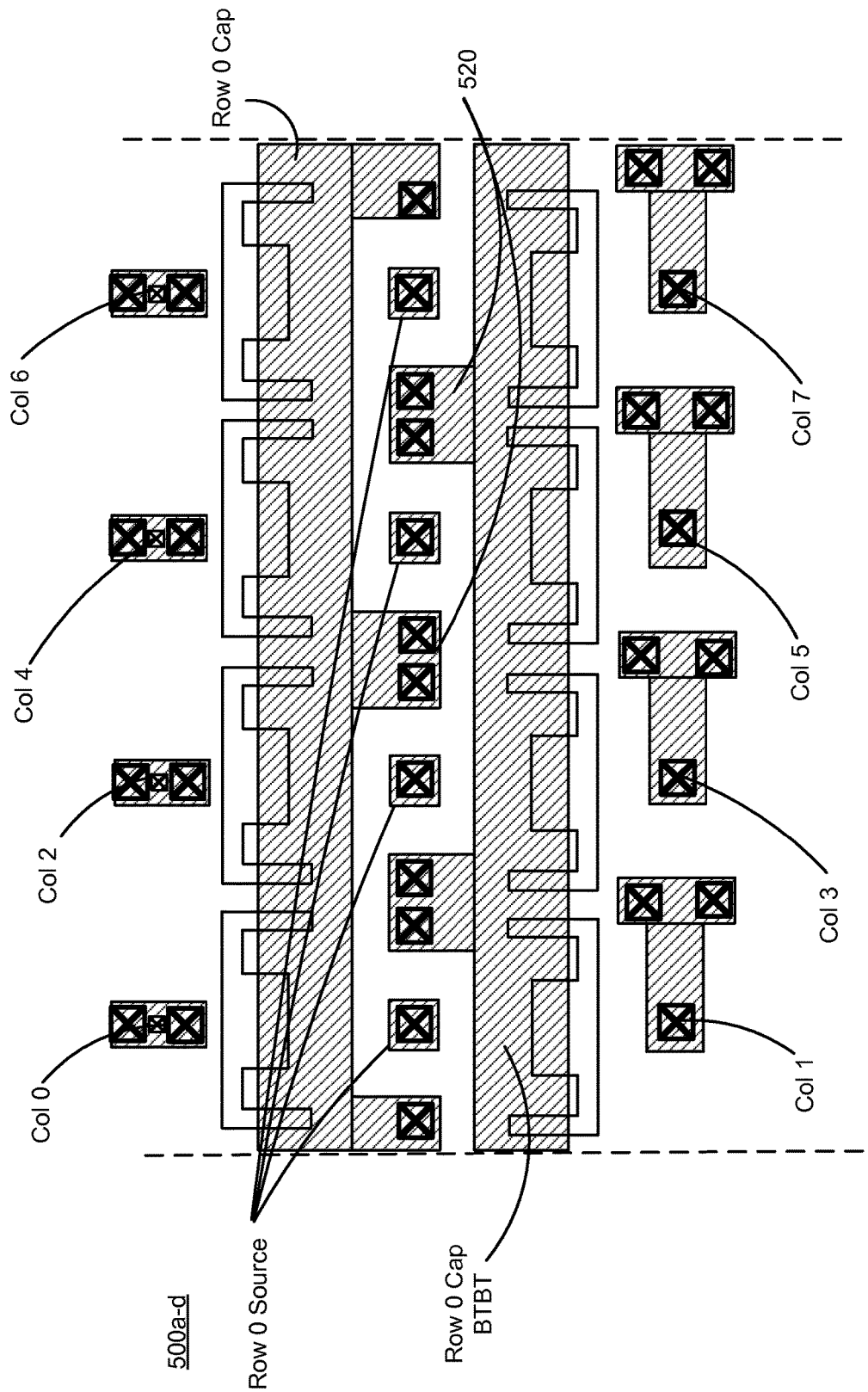
FIG. 5C is a top view of a paired NVM bitcell array with metal layers according to one embodiment.

FIG. 5C is a top view of a paired NVM bitcell array with the first layer of metal, the metal to active silicon contact, with the floating gate overlaid according to one embodiment. In FIG. 5C, the floating gates 406 of the bitcells 400 are overlaid for readability only, as the floating gates are electrically isolated from the metal layers which power the bitcells. In one embodiment, the row metal layers for the capacitors 410 and BTBT capacitors 430 generally run horizontally such that they are generally parallel with the row of bitcells 400. In one embodiment, the row metal layers for the capacitors 410 and BTBT capacitors 430 comprise overlap sections 520 that protrude from the row metal layers to electrically coupled the capacitors 410 and BTBT capacitor 430. These overlap sections 520 may be interlaced between the Row 0 Cap and Row 0 Cap BTBT metal layers in order to further save space in the overall size of the bitcell array. Additional electrical connections to the bitcells are made in the second and third metal layer. The source contacts are all connect together in the second metal layer that runs horizontally. The column connects go though the second layer of metal up to the third layer of metal that runs vertically.

Figure 6:
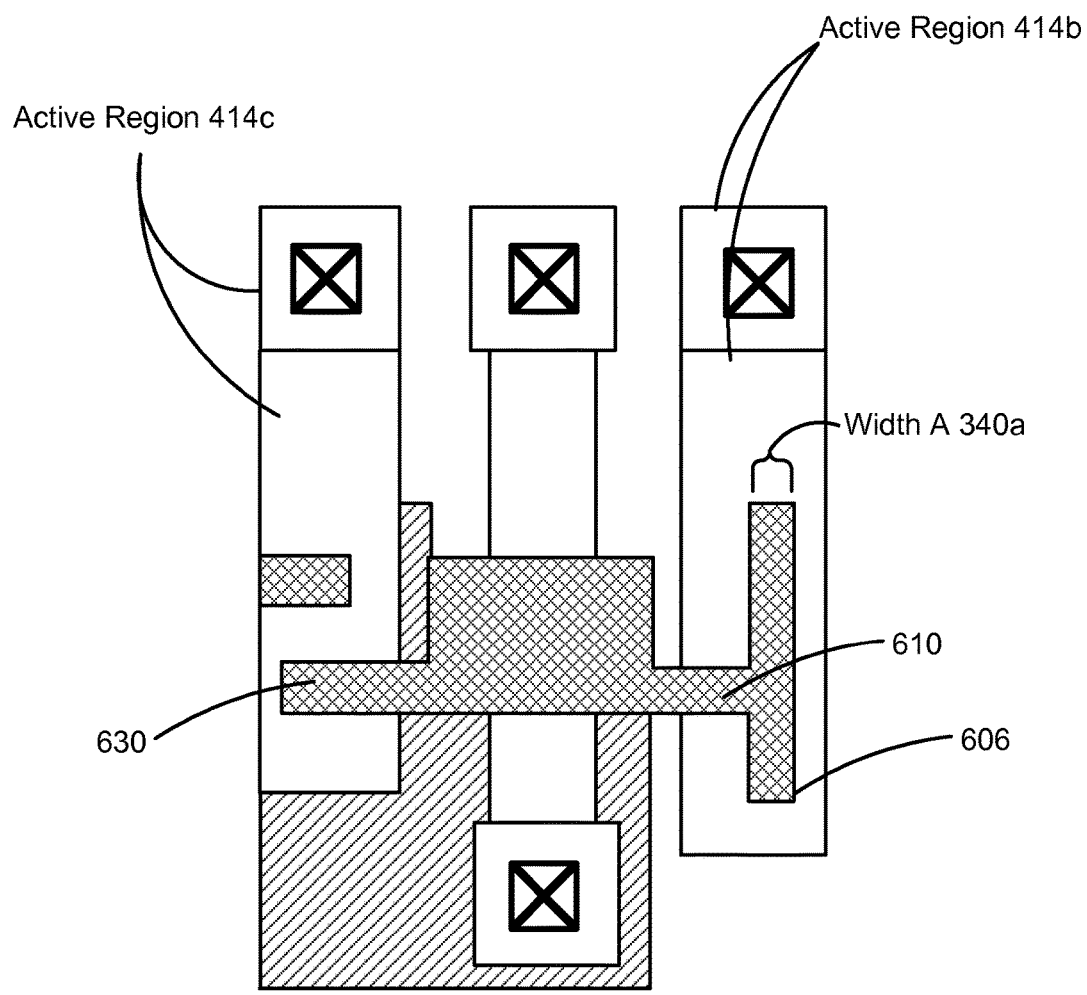
FIG. 6 is a top view of a paired NVM bitcell array with a modified capacitor structure according to one embodiment.

FIG. 6 is a top view of a paired NVM bitcell array with a modified capacitor structure according to one embodiment. In the embodiment of FIG. 6 the shape and size of the floating gate 606 has been altered to change the surface area of the floating gate 606 over the second 414b and third 414c active regions compared to the embodiment illustrated in FIG. 4A. At all points above the second active region 414b, floating gate 606 has a width A 640a that is less than or equal to the width described above where implants into the second active region 414b are still able penetrate all the way underneath the floating gate 606." Wider widths are contemplated, however additional width beyond width A 640a do not contribute additional capacitance to the capacitor 610 when the floating gate voltage is below a $V_T$ of the device.

Other shapes that alter the surface area of the floating gate 606 are also contemplated. In bitcell 600, the capacitor 610 is made larger to increase control over the voltage of the floating gate 606. The BTBT capacitor 630 is made smaller to reduce coupling between the third active region voltage 414c and the floating gate 606 during the BTBT operation. The width of the BTBT capacitor 630 may be altered to have the BTBT implant (e.g., a halo implant) merge below the floating gate 606 in the third active region 414c to maximize the dopant concentration gradient for BTBT operation. The doping concentration of the well can be further increased by adding any other implants in the process that affect the surface doping in the third active region 414c. For example, a $V_T$ adjust implant can also be added to the BTBT capacitor 630.

In one embodiment, the P/N junction between the LDD and halo region in the BTBT capacitor 630 is formed using implants from two different photo steps. For example, the implants may include a source drain extension implant of a first polarity and a LDD implant of a second polarity. If, for example, the BTBT capacitor has an N-channel, the source drain extension implant may be a 1.8V N-type source-drain extension implant, and the LDD implant may be a 5V P-type LDD implant. The 5V P-type LDD implant is done with a lower dose (e.g., lower density of charge carriers), higher energy implant relative to the 1.8 N-type source-drain extension implant. These two implants overlap forming a P/N junction underneath the BTBT capacitor 630. As a consequence, the LDD implant acts as a halo implant for the BTBT capacitor 630. If the 1.8V N-type source-drain extension implant has forms its own dedicated halo region in the same photo step, then the BTBT capacitor 630 will have a halo region that is a combination of both the 1.8V implant's halo region and the 5V LDD implant's halo region.

In one embodiment of the halo implant in the BTBT capacitor 630, the LDD implant has a charge carrier concentration of at least 1e19 atoms/cm³ on one side of the P/N junction, and the source-drain extension implant has a charge carrier concentration of at least 1e20 atoms/cm³ on the other side of the P/N junction. In another embodiment of the halo implant in the BTBT capacitor 630, the LDD implant has a charge carrier concentration of at least 1e18 atoms/cm³ on one side of the P/N junction, and the source-drain extension implant has a charge carrier concentration of at least 1e20 atoms/cm³ on the other side of the P/N junction.

The combination of implants at the opposite BTBT capacitor will cause the BTBT capacitor to have a halo region that has a higher dopant concentration than anywhere on the first 414a or second 414b active regions, including the source 402, drain 404, capacitor 610, or any other halo implant on the device. In one embodiment, the LDD implant and source drain extension implant that form the halo implant on the BTBT capacitor 630 are used elsewhere in the manufacturing process used to create the bitcell 600. In this case, the halo implant (and the bitcell generally) can be formed without any additional processing steps, as the implants used to create the halo implant are already part of the manufacturing process for the bitcell 600.

In another embodiment two halo implants can be combined to make the BTBT capacitor 630. For example, a process used to create a bitcell 600 may include steps for creating a 1.0V logic device that incorporates a first halo implant. The same process may include steps for creating a 1.8V I/O device that incorporates a second halo implant with different dosage and/or energy compared to the first halo implant. In this embodiment, both of these halo implants may also be implanted in the third active region 414c of the bitcell 600 to form the BTBT capacitor 630. The combination of halo implants 630 form a halo with a higher dose than that of either the 1.0V logic device or 1.8V I/O device. The transistor used to read the floating gate may use the logic halo on the drain and I/O halo on the source.

Decoupled Capacitor and BTBT Capacitor Bitcell Operation

As with bitcell 100, bitcell 400 uses band-to-band tunneling (BTBT) to program the floating gate, and uses channel hot electron injection (CHEI) or impact ionized hot election injection (IHEI), depending upon whether the bitcell is P-type or N-type, to erase the floating gate. The following description describes operation of a N-type bitcell 400 using CHEI to erase, however the concepts apply equally to a P-type bitcell using IHEI to erase instead.

As with bitcell 100, bitcell 400 has the advantage that because capacitor 410 is decoupled from both the source 402 and the drain 404, the capacitor 410 can be used to adjust the voltage on the floating gate 406 without affecting the voltages at the source 402 or the drain 404. The same holds true for the BTBT capacitor 430. Due to the capacitance between floating gate 406 and the second 414b and third 414c active regions, the floating gate 406 voltage will be a proportion of whatever voltage is applied at the second 414b and third 414c active regions. The ability to bias the floating gate 406 without affecting the source 402 or drain 404 voltage benefits read, write, and erase operations.

Erasure of the floating gate 406 via CHEI may be accomplished in the same manner as in bitcell 100. Bitcell 400 has the same benefits of bitcell 100, for example the ability to maintain higher CHEI efficiency by altering the voltage on the capacitor 410 and BTBT capacitor 430 during erasure. During erasure, capacitor 410 and BTBT capacitor 430 perform the same function of altering the voltage on the floating gate 406 to achieve higher CHEI efficiency. Bitcell 400 is similarly able to take advantage of increased CHEI efficiency to lower the overall size of the bitcell by reducing the size of the charge pump needed to perform CHEI erase operations.

Writing to the floating gate 406 of bitcell 400 via BTBT occurs differently than in bitcell 100. To write to the floating gate 406 via BTBT, a large voltage is applied to the BTBT capacitor 430. BTBT occurs when a strong electric field is present underneath a floating gate 406 in the diode depletion region. The diode depletion region borders a diode junction is between a source extension and (or an LDD implant) a BTBT implant 440 in the third active region 414c. The presence of a high voltage, for example 6-8V, at the diode junction causes charge carriers to tunnel over to the floating gate 406.

Bitcell 400 is particularly advantageous in that it is not susceptible to "slow bits" or "fast bits" as described above. As BTBT capacitor 430 is isolated from the channel region 408, a current path is prevented from forming due to BTBT. Because a current cannot flow through channel region 408 when writing using BTBT, a "fast bit" cannot accidentally prevent the writing of other bitcells in the same row/column. Nor can the other cells in a row prevent a "slow bit" from being programmed.

Reading of the floating gate 406 may be accomplished in the same manner as in bitcell 100. During reading, capacitor 410 and BTBT capacitor 430 perform the same function of altering the voltage on the floating gate 406 to affect which bits are read at any given time. To read the voltage on floating gate 406, the source 402, drain 404, capacitor 410, and BTBT capacitor 430 are set to different voltages that will activate or not activate bitcell 400 depending upon the voltage on the floating gate 406. The voltage on the capacitor 110 and BTBT capacitor 430 may be altered to selectively read particular bitcells 400 in the bitcell array. Bitcell 400 has the same benefits as bitcell 100 over existing nonvolatile memory bitcells, for example with respect to improving read times and implementing adaptive read schemes.

Table 2 set forth below illustrates read, write, and erase operation for an example N-type embodiment.

(e.g., a bitcell including gates, metal layers, vias) in the integrated circuit design. Packaging and assembly processes 738 are performed, which result in finished chips 740.

The EDA software 712 may be implemented in one or more computing devices including a memory. An example of a memory is a non-transitory computer readable storage medium. For example, the EDA software 712 is stored as instructions in the computer-readable storage medium which are executed by a processor for performing operations 714-732 of the design flow, which are described below. This design flow description is for illustration purposes. In particular, this description is not meant to limit the present disclosure. For example, an actual integrated circuit design may require a designer to perform the design operations in a difference sequence than the sequence described herein.

A cell library incorporating one or more NVM bitcells or circuits as described above with reference to FIGS. 1A through 6 may be stored in the memory. The cell library may be referenced by the EDA software 712 to create a circuit or electronic device incorporating the NVM bitcells or circuits.

During system design 714, designers describe the functionality to implement. They can also perform what-if planning to refine the functionality and to check costs. Note that hardware-software architecture partitioning can occur at this stage. During logic design and functional verification 716, VHDL or Verilog code for modules in the circuit is written and the design is checked for functional accuracy. More

TABLE 2

Bitcell 400 Operation

| Operation | Drain (Column) | Source (Row) | Capacitor (Row) | BTBT Capacitor (Row) | Notes/ Transport Mechanism |
|---|---|---|---|---|---|
| Read Selected Row | Pre-charge 0 V | Vread 3 V | Vread_cap 1-4 V | Vread_btbt_cap 1-4 V | Couple up selected row |
| Read Unselected Row | Pre-charge 0 V | 0 V | 0 V | 0 V | |
| Erase Selected Row (set bit to 0) | 0 V | Vinj 7 V | Verase_cap 0-7 V | Verase_btbt_cap 0-7 V | CHI inject e-, capacitors set to give peak e- injection efficiency |
| Inhibit Erase on Selected Row (stay at 1) | Vinj_inhibit 2-4 V or float | Vinj 3-5 V | Verase_cap 4-8 V | Verase_btbt_cap 2-8 V | inhibit e- injection |
| Inihibit Erase on Unselected Row (stay at 1) | X same as selected row, 2-4 V | 0 V | 0 V | 0 V | inhibit e- inject |
| Write Row (set bit to 1) | 0 V | 0 V | 0 V | Vprog (6-8 V) | BTBT, inject h+ per row *no high voltage needed on column |
| Inhibit Write on Row (stay at 0) | 0 V | 0 V | 0 V | 0 V | BTBT, inhibit h+ inject |

Overview of Electronic Design Automation Design Flow

Figure 7:
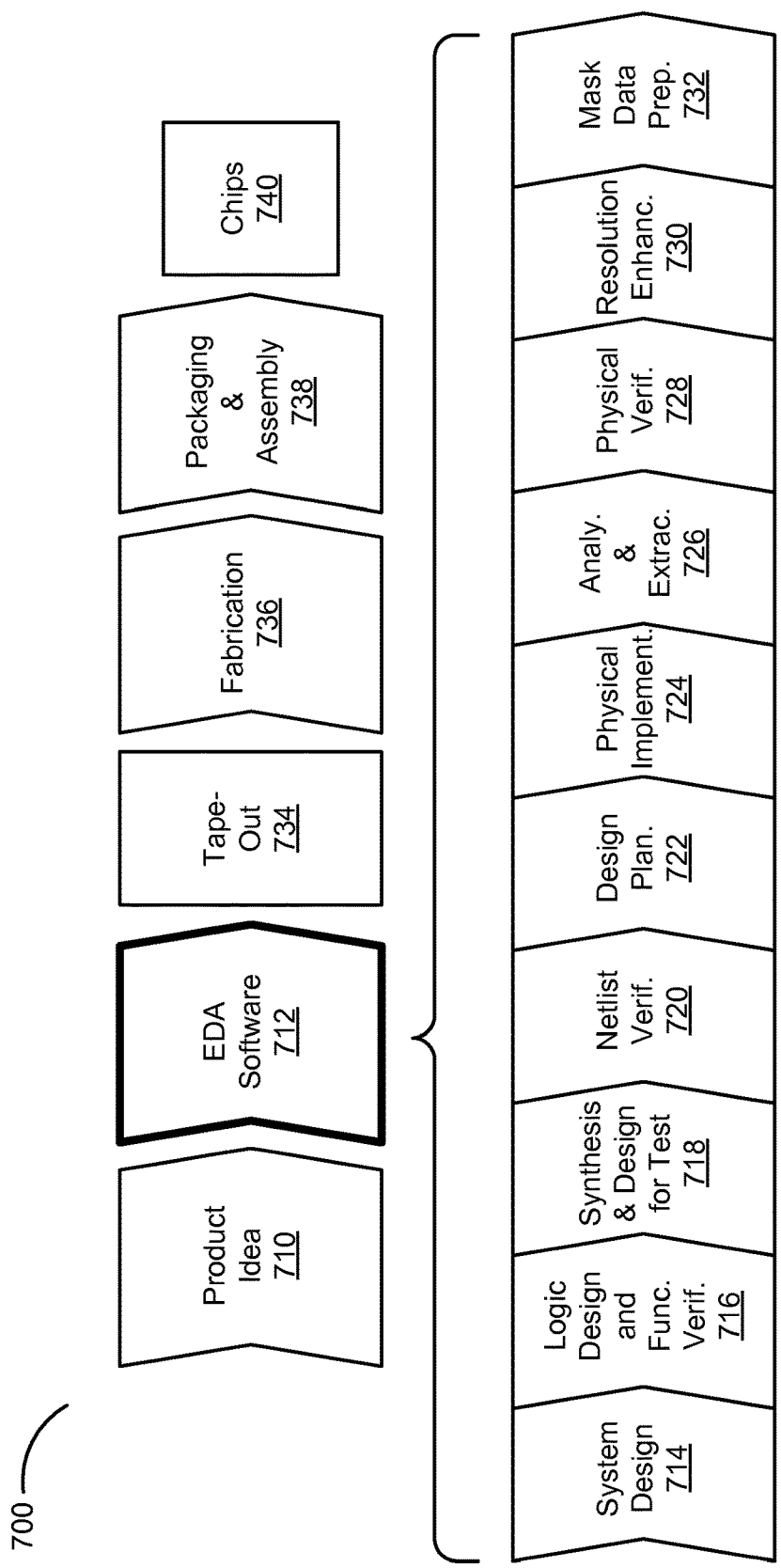
FIG. 7 is a flowchart illustrating the various operations in the design and fabrication of an integrated circuit, according to one embodiment.

FIG. 7 is a flowchart 700 illustrating the various operations in the design and fabrication of an integrated circuit. This process starts with the generation of a product idea 710, which is realized during a design process that uses electronic design automation (EDA) software 712. When the design is finalized, it can be taped-out 734. After tape-out, a semiconductor die is fabricated 736 to form the various objects specifically, the design is checked to ensure that it produces the correct outputs. During synthesis and design for test 718, VHDL/Verilog is translated to a netlist. This netlist can be optimized for the target technology. Additionally, tests can be designed and implemented to check the finished chips. During netlist verification 720, the netlist is checked for compliance with timing constraints and for correspondence with the VHDL/Verilog source code.

During design planning 722, an overall floor plan for the chip is constructed and analyzed for timing and top-level routing. Example EDA software products from Synopsys, Inc. of Mountain View, Calif. that can be used at this stage include: Astro® and IC Compiler® products. During physical implementation 724, the placement (positioning of circuit elements) and routing (connection of the same) occurs. During analysis and extraction 726, the circuit function is verified at a transistor level, which permits refinement. During physical verification 728, the design is checked to ensure correctness for: manufacturing, electrical issues, lithographic issues, and circuitry. During resolution enhancement 730, geometric manipulations of the layout are performed to improve manufacturability of the design. During mask-data preparation 732, the 'tape-out' data for production of masks to produce finished chips is provided.

Embodiments of the present disclosure can be used during one or more of the above-described stages. Specifically, in some embodiments the present disclosure can be used in EDA software 712 that includes operations between design planning 722 and physical implementation 224.

Additional Considerations

The bitcell has wide applicability. For example, the bitcell may be used as an alternative to expensive flash memory. Flash memory is expensive because it requires a number of additional process steps to create that are not part of the standard CMOS logic process and it adds a significant amount of heat. In contrast, the bitcell can be constructed using the existing CMOS logic process no additional process steps.

Flash memory is characterized by a high amount of floating gate to control gate capacitance (e.g., 70% capacitance). Much of this capacitance is on the side wall of the floating gate, which results in a tall gate stack that makes the device difficult to integrate with the other devices in the process.

Upon reading this disclosure, a reader will appreciate still additional alternative structural and functional designs through the disclosed principles herein. Thus, while particular embodiments and applications have been illustrated and described, it is to be understood that the disclosed embodiments are not limited to the precise construction and components disclosed herein. Various modifications, changes and variations, which will be apparent to those skilled in the art, may be made in the arrangement, operation and details of the method and apparatus disclosed herein without departing from the spirit and scope defined in the appended claims.

What is claimed is:

1. An electronic design automation (EDA) tool for instantiating a paired non-volatile memory (NVM) bitcell on a semiconductor device, the EDA tool comprising instructions stored in a non-transitory computer readable medium, the instructions when executed by a processor cause the processor to:
select a paired NVM bitcell electronic design from a cell library, the paired NVM bitcell electronic design comprising a first bitcell having an electrically isolated floating gate and a first plurality of contacts and a second bitcell having a second isolated floating gate and a second plurality of electrical contacts; and
route connections between the first plurality of contacts and the second plurality of contacts to control operation of each bitcell of the paired NVM bitcell, the connections comprising:
a first connection extending in a first direction and connecting a first source contact of the first bitcell with a second source contact of the second bitcell,
a second connection extending in the first direction and connecting a first capacitor of the first bitcell to a first capacitor of the second bitcell,
a third connection extending in the first direction and connecting a second capacitor of the first bitcell to a second capacitor of the second bitcell,
a fourth connection extending in a second direction perpendicular to the first direction and connecting to a drain contact of the first bitcell, and
a fifth connection extending in the second direction and connecting to a drain contact of the second bitcell.

2. The EDA tool of claim 1, wherein the EDA tool further comprising instructions causing the processor to:
select a plurality of paired NVM bitcells from the cell library, each of the paired NVM bitcells having an electronic design identical to the paired NVM bitcell electronic design; and
route extended connections between contacts of the paired NVM bitcell and contacts of the plurality of paired NVM bitcells to control operation of each bitcell of the paired NVM bitcell and each bitcell of the plurality of paired NVM bitcells, the extended connections comprising:
an extended first connection extending the first connection in the first direction to further connect the first and second source contacts of the paired NVM bitcell with source contacts of at least one of the paired NVM bitcells,
an extended second connection extending the second connection in the first direction to further connect the first capacitors of the paired NVM bitcell with first capacitors of the at least one of the paired NVM bitcells,
an extended third connection extending the third connection in the first direction to further connect the second capacitors of the paired NVM bitcell with second capacitors of the at least one of the paired NVM bitcells,
an extended fourth connection extending the fourth connection in the second direction to further connect the drain contact of the first bitcell with one or more drain contacts of one or more paired NVM bitcells of the plurality of paired NVM bitcells, and
an extended fifth connection extending the fifth connection in the second direction to further connect the drain contact of the second bitcell with one or more other drain contacts of the one or more paired NVM bitcells.

3. The EDA tool of claim 1, wherein the EDA tool further comprising instructions causing the processor to:
select another paired NVM bitcell electronic design from the cell library, the other paired NVM bitcell electronic design comprising a pair of bitcells each having a band-to-band tunneling (BTBT) capacitor formed between an electrically isolated floating gate of that bitcell and an active region of that bitcell; and
route an extended connection between contacts of the paired NVM bitcell and contacts of the other paired NVM bitcell to control operation of each bitcell of the paired NVM bitcell and each bitcell of the other paired NVM bitcell, the extended connection comprising
an extended third connection extending the third connection in the first direction to further connect the second capacitors of the paired NVM bitcell with the BTBT capacitor in each bitcell of the other paired NVM bitcell.

4. The EDA tool of claim 1, wherein the EDA tool further comprising instructions causing the processor to:
select another paired NVM bitcell electronic design from the cell library, the other paired NVM bitcell electronic design comprising a pair of bitcells each having a capacitor formed between an electrically isolated floating gate of that bitcell and an active region of that bitcell and a band-to-band tunneling (BTBT) capacitor formed between the floating gate and another active region of that bitcell; and
route extended connections between contacts of the paired NVM bitcell and contacts of the other paired NVM bitcell to control operation of each bitcell of the paired NVM bitcell and each bitcell of the other paired NVM bitcell, the extended connections comprising
a first metal layer connecting the second connection of the paired NVMN bitcell with the capacitor in each bitcell of the other paired NVM bitcell, and
another first metal layer connecting the third connection of the paired NVMN bitcell with the BTBT capacitor in each bitcell of the other paired NVM bitcell.

5. The EDA tool of claim 4, wherein the first metal layer is substantially parallel to the other first metal layer and routed in the first direction.

6. The EDA tool of claim 4, wherein the extended connections further comprising a second metal layer connecting the first and second source contacts of the paired NVM bitcell with source contacts of the other paired NVM bitcell.

7. The EDA tool of claim 6, wherein the first metal layer, the other first metal layer and the second metal layer are substantially parallel and routed in the first direction.

8. The EDA tool of claim 4, wherein the extended connections further comprising:
a first column connection extending through a second layer of metal up to a third layer of metal to connect the drain contact of the first bitcell with a first drain contact of the other paired NVM bitcell; and
a second column connection extending through the second layer of metal up to the third layer of metal to connect the drain contact of the second bitcell with a second drain contact of the other paired NVM bitcell.

9. The EDA tool of claim 8, wherein the first and second column connections are substantially parallel and routed in the second direction.

10. A computer implemented method for instantiating a paired non-volatile memory (NVM) bitcell on a semiconductor device performed by a processor, the method comprising:
selecting a paired NVM bitcell electronic design from a cell library, the paired NVM bitcell electronic design comprising a first bitcell having an electrically isolated floating gate and a first plurality of contacts and a second bitcell having a second isolated floating gate and a second plurality of electrical contacts; and
routing connections between the first plurality of contacts and the second plurality of contacts to control operation of each bitcell of the paired NVM bitcell, the connections comprising:
a first connection extending in a first direction and connecting a first source contact of the first bitcell with a second source contact of the second bitcell,
a second connection extending in the first direction and connecting a first capacitor of the first bitcell to a first capacitor of the second bitcell,
a third connection extending in the first direction and connecting a second capacitor of the first bitcell to a second capacitor of the second bitcell,
a fourth connection extending in a second direction perpendicular to the first direction and connecting to a drain contact of the first bitcell, and
a fifth connection extending in the second direction and connecting to a drain contact of the second bitcell.

11. The method of claim 10, further comprising:
selecting a plurality of paired NVM bitcells from the cell library, each of the paired NVM bitcells having an electronic design identical to the paired NVM bitcell electronic design; and
routing extended connections between contacts of the paired NVM bitcell and contacts of the plurality of paired NVM bitcells to control operation of each bitcell of the paired NVM bitcell and each bitcell of the plurality of paired NVM bitcells, the extended connections comprising:
an extended first connection extending the first connection in the first direction to further connect the first and second source contacts of the paired NVM bitcell with source contacts of at least one of the paired NVM bitcells,
an extended second connection extending the second connection in the first direction to further connect the first capacitors of the paired NVM bitcell with first capacitors of the at least one of the paired NVM bitcells,
an extended third connection extending the third connection in the first direction to further connect the second capacitors of the paired NVM bitcell with second capacitors of the at least one of the paired NVM bitcells,
an extended fourth connection extending the fourth connection in the second direction to further connect the drain contact of the first bitcell with one or more drain contacts of one or more paired NVM bitcells of the plurality of paired NVM bitcells, and
an extended fifth connection extending the fifth connection in the second direction to further connect the drain contact of the second bitcell with one or more other drain contacts of the one or more paired NVM bitcells.

12. The method of claim 10, further comprising:
selecting another paired NVM bitcell electronic design from the cell library, the other paired NVM bitcell electronic design comprising a pair of bitcells each having a band-to-band tunneling (BTBT) capacitor formed between an electrically isolated floating gate of that bitcell and an active region of that bitcell; and
routing an extended connection between contacts of the paired NVM bitcell and contacts of the other paired NVM bitcell to control operation of each bitcell of the paired NVM bitcell and each bitcell of the other paired NVM bitcell, the extended connection comprising
an extended third connection extending the third connection in the first direction to further connect the second capacitors of the paired NVM bitcell with the BTBT capacitor in each bitcell of the other paired NVM bitcell.

13. The method of claim 10, further comprising:
selecting another paired NVM bitcell electronic design from the cell library, the other paired NVM bitcell electronic design comprising a pair of bitcells each having a capacitor formed between an electrically isolated floating gate of that bitcell and an active region of that bitcell and a band-to-band tunneling (BTBT) capacitor formed between the floating gate and another active region of that bitcell; and routing extended connections between contacts of the paired NVM bitcell and contacts of the other paired NVM bitcell to control operation of each bitcell of the paired NVM bitcell and each bitcell of the other paired NVM bitcell, the extended connections comprising a first metal layer connecting the second connection of the paired NVMN bitcell with the capacitor in each bitcell of the other paired NVM bitcell, and another first metal layer connecting the third connection of the paired NVMN bitcell with the BTBT capacitor in each bitcell of the other paired NVM bitcell.

14. The method of claim 13, wherein the first metal layer is substantially parallel to the other first metal layer and routed in the first direction.

15. The method of claim 13, wherein the extended connections further comprising a second metal layer connecting the first and second source contacts of the paired NVM bitcell with source contacts of the other paired NVM bitcell.

16. The method of claim 15, wherein the first metal layer, the other first metal layer and the second metal layer are substantially parallel and routed in the first direction.

17. The method of claim 13, wherein the extended connections further comprising:

a first column connection extending through a second layer of metal up to a third layer of metal to connect the drain contact of the first bitcell with a first drain contact of the other paired NVM bitcell; and a second column connection extending through the second layer of metal up to the third layer of metal to connect the drain contact of the second bitcell with a second drain contact of the other paired NVM bitcell.

18. The method of claim 7, wherein the first and second column connections are substantially parallel and routed in the second direction.

19. A non-transitory computer readable medium storing instructions for instantiating a paired non-volatile memory (NVM) bitcell on a semiconductor device, the instructions when executed by a processor cause the processor to:

select a paired NVM bitcell electronic design from a cell library, the paired NVM bitcell electronic design comprising a first bitcell having an electrically isolated floating gate and a first plurality of contacts and a second bitcell having a second isolated floating gate and a second plurality of electrical contacts; and route connections between the first plurality of contacts and the second plurality of contacts to control operation of each bitcell of the paired NVM bitcell, the connections comprising:

a first connection extending in a first direction and connecting a first source contact of the first bitcell with a second source contact of the second bitcell, a second connection extending in the first direction and connecting a first capacitor of the first bitcell to a first capacitor of the second bitcell, a third connection extending in the first direction and connecting a second capacitor of the first bitcell to a second capacitor of the second bitcell, a fourth connection extending in a second direction perpendicular to the first direction and connecting to a drain contact of the first bitcell, and a fifth connection extending in the second direction and connecting to a drain contact of the second bitcell.

20. The non-transitory computer readable medium of claim 19, wherein the instructions when executed by the processor further cause the processor to:

select another paired NVM bitcell electronic design from the cell library, the other paired NVM bitcell electronic design comprising a pair of bitcells each having a band-to-band tunneling (BTBT) capacitor formed between an electrically isolated floating gate of that bitcell and an active region of that bitcell; and route an extended connection between contacts of the paired NVM bitcell and contacts of the other paired NVM bitcell to control operation of each bitcell of the paired NVM bitcell and each bitcell of the other paired NVM bitcell, the extended connection comprising an extended third connection extending the third connection in the first direction to further connect the second capacitors of the paired NVM bitcell with the BTBT capacitor in each bitcell of the other paired NVM bitcell.

* * * * *

UNITED STATES PATENT AND TRADEMARK OFFICE
CERTIFICATE OF CORRECTION

PATENT NO. : 10,468,426 B2  
APPLICATION NO. : 15/841206  
DATED : November 5, 2019  
INVENTOR(S) : Andrew E. Horch It is certified that error appears in the above-identified patent and that said Letters Patent is hereby corrected as shown below:

In the Claims

In Column 23, Claim 13, Line 13, delete "NVMN bitcell" and insert --NVM bitcell--

In Column 23, Claim 13, Line 16, delete "NVMN bitcell" and insert --NVM bitcell--

Signed and Sealed this
Fourth Day of August, 2020

Andrei Iancu
*Director of the United States Patent and Trademark Office*